US008876453B2

(12) United States Patent
Aburatani et al.

(10) Patent No.: US 8,876,453 B2
(45) Date of Patent: Nov. 4, 2014

(54) SUBSTRATE PROCESSING APPARATUS AND METHOD OF MANUFACTURING SEMICONDUCTOR DEVICE

(75) Inventors: Yukinori Aburatani, Toyama (JP);
Masakazu Shimada, Toyama (JP);
Osamu Morita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 111 days.

(21) Appl. No.: 13/004,495

(22) Filed: Jan. 11, 2011

(65) Prior Publication Data

US 2011/0170989 A1   Jul. 14, 2011

(30) Foreign Application Priority Data

Jan. 12, 2010 (JP) ................................. 2010-003644
Jan. 12, 2010 (JP) ................................. 2010-003884
Oct. 7, 2010 (JP) ................................. 2010-227766

(51) Int. Cl.
*H01L 21/31* (2006.01)
*H01L 21/67* (2006.01)

(52) U.S. Cl.
CPC ............................ *H01L 21/67109* (2013.01)
USPC ........................................... 414/161; 414/804

(58) Field of Classification Search
CPC ......... H01L 21/67; H01L 21/677; H02P 6/08; H02P 7/00; H02P 7/009; H02P 7/06; H02P 7/18; H02P 7/20; H02P 7/22; H02P 7/24; H02P 7/245; H02P 7/26; H02P 7/265; H02P 7/28; H02P 8/005; H02P 8/12; H02P 8/14
USPC ............... 414/217, 217.1, 331.09, 331.14, 414/331.15, 331.17, 331.18; 438/107, 110; 445/22, 23, 35, 46, 65, 66; 318/61, 66, 318/163, 260, 271, 400.07, 433
IPC ........................................... H01L 21/67,21/677
See application file for complete search history.

(56) References Cited

U.S. PATENT DOCUMENTS

| 4,093,898 | A | * | 6/1978 | Morters et al. ................. 318/740 |
| 4,484,126 | A | * | 11/1984 | Fulton et al. ................... 318/800 |
| 4,618,805 | A | * | 10/1986 | Hornung ........................ 318/245 |

(Continued)

FOREIGN PATENT DOCUMENTS

| JP | 06-043940 A | 2/1994 |
| JP | 07-230320 A | 8/1995 |

(Continued)

*Primary Examiner* — James Keenan
*Assistant Examiner* — Brendan Tighe
(74) *Attorney, Agent, or Firm* — Volpe and Koenig, P.C.

(57) ABSTRACT

A substrate processing apparatus suppresses vibration of a cover when unloading a boat from a process pipe. The apparatus comprises a boat for placing a substrate, a process pipe configured to accommodate the boat, a cover having the boat placed thereon, the cover configured to open and close a furnace port installed on a lower end of the process pipe, a motor to drive an elevation mechanism which moves the cover upward and downward, a sealing member to seal a space between the cover and the process pipe, and a controller to control motor speed and limit motor torque while the cover moves from the furnace port to a predetermined position. The substrate is maintained at a rest position in the boat during a recovery from a deformation of the cover occurring when separating the sealing member from the cover surface or the process pipe surface.

6 Claims, 14 Drawing Sheets

(56) References Cited

U.S. PATENT DOCUMENTS

| | | | | |
|---|---|---|---|---|
| 4,712,052 A | * | 12/1987 | Omae et al. | 318/625 |
| 5,047,702 A | * | 9/1991 | Hanaki et al. | 318/625 |
| 5,562,383 A | * | 10/1996 | Iwai et al. | 414/217.1 |
| 5,726,890 A | * | 3/1998 | Takamoto et al. | 701/70 |
| 6,287,984 B1 | * | 9/2001 | Horie | 438/758 |
| 6,887,129 B2 | * | 5/2005 | Birang et al. | 451/10 |
| 6,995,533 B2 | * | 2/2006 | Fitzgibbon et al. | 318/434 |
| 7,198,447 B2 | * | 4/2007 | Morimitsu et al. | 414/217 |
| 7,224,141 B2 | * | 5/2007 | Ide | 318/807 |
| 7,911,172 B2 | * | 3/2011 | Ikeda et al. | 318/621 |
| 7,969,113 B2 | * | 6/2011 | Ide | 318/611 |
| 2005/0113977 A1 | * | 5/2005 | Nihei et al. | 700/245 |
| 2008/0111514 A1 | * | 5/2008 | Ohta et al. | 318/609 |
| 2010/0223277 A1 | * | 9/2010 | Yamaguchi et al. | 707/769 |
| 2010/0295497 A1 | * | 11/2010 | Takamatsu | 318/671 |

FOREIGN PATENT DOCUMENTS

| | | |
|---|---|---|
| JP | 2004-104011 A | 4/2004 |
| JP | 2005056905 A | 3/2005 |
| JP | 2008-277354 A | 11/2008 |
| JP | 2009-145197 A | 7/2009 |
| KR | 1020090023184 A | 3/2009 |

* cited by examiner

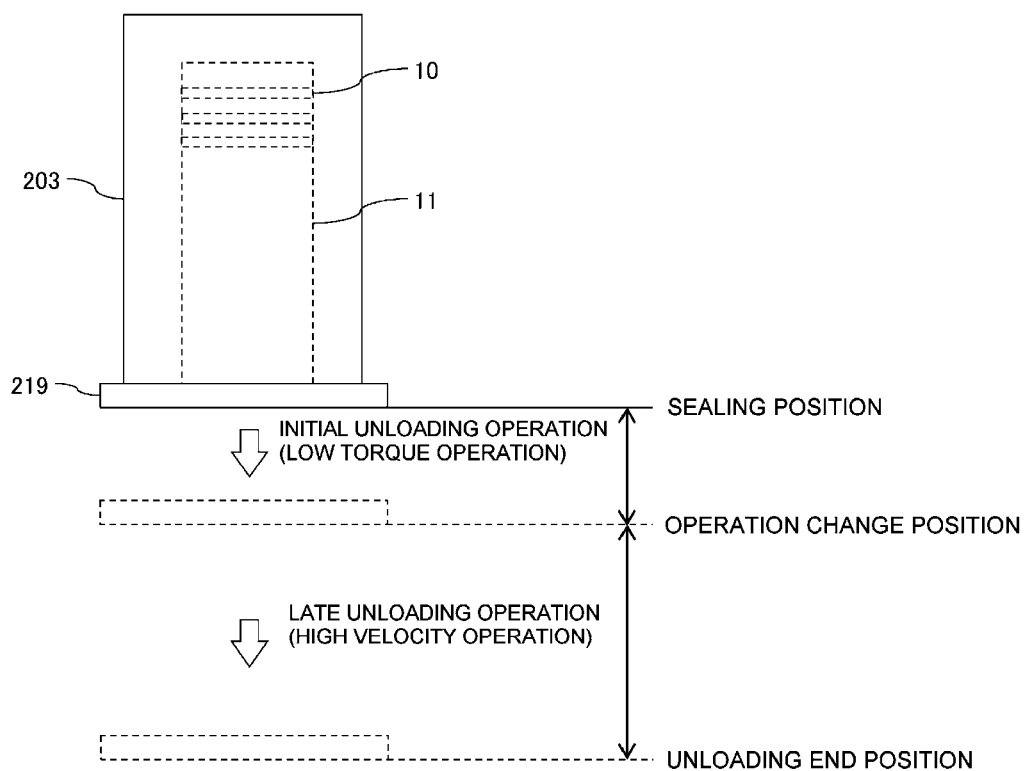

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2010-003644 filed on Jan. 12, 2010, Japanese Patent Application No. 2010-003884 filed on Jan. 12, 2010, and Japanese Patent Application No. 2010-227766 filed on Oct. 7, 2010, in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device.

2. Description of the Related Art

A related art substrate processing apparatus configured to perform one of processes of manufacturing a semiconductor device or processes of manufacturing a display device includes a process pipe configured to process a substrate, a boat configured to place the substrate, a cover configured to open and close a furnace port disposed at the lower end of the process pipe, an elevation mechanism configured to move both the boat and the cover upward and downward to load the boat into the process pipe and press the cover against the furnace port, a motor configured to drive the elevation mechanism, and a sealing member configured to seal the space between the cover and the lower end of the process pipe.

After a substrate is processed, the cover is moved downward to unload the boat from the inside of the process pipe. At this time, in the state where the sealing member is adhered to the lower end surface of the process pipe, a downward movement of the cover is started. As a result, in the process where the sealing member is peeled off from the lower end surface of the process pipe, the cover is bent and vibrates to recover from the bending, and then, the vibration is transmitted to the boat placed on the cover. Thus, the substrate placed on the boat may bounce up or may fall down from the boat, and may be damaged.

SUMMARY OF THE INVENTION

An object of the present invention is to provide a substrate processing apparatus and a method of manufacturing a semiconductor device, which can suppress the vibration of a cover occurring in an initial stage that a boat is unloaded from the inside of a process pipe.

According to an aspect of the present invention, there is provided a substrate processing apparatus comprising: a boat for placing a substrate, a process pipe configured to accommodate the boat, a cover having the boat placed thereon, the cover being configured to open and close a furnace port installed on a lower end of the process pipe, an elevation mechanism configured to move the cover upward and downward, a motor configured to drive the elevation mechanism, a sealing member configured to seal a space between the cover and a lower end surface of the process pipe, and a controller configured to control a speed of the motor and limit a torque of the motor while the cover is moved from the furnace port to a predetermined position such that the substrate is maintained at a rest position in the boat during a recovery from a deformation of the cover occurring when the sealing member is separated from a surface of the cover or the lower end surface of the process pipe.

According to another aspect of the present invention, there is provided a method of manufacturing a semiconductor device, which includes opening a furnace port of a process pipe by lowering a cover sealing the furnace port via a sealing member after a substrate placed on a boat is processed with in the process pipe and simultaneously unloading the boat within the process pipe from the furnace port, controlling a speed of a motor driving an elevation mechanism moving the cover downward and simultaneously limiting a torque of the motor while the cover is moved from the furnace port to a predetermined position such that the substrate is maintained at a rest position in the boat during a recovery from a deformation of the cover occurring when the sealing member is separated from a surface of the cover or a lower end surface of the process pipe.

BRIEF DESCRIPTION OF THE DRAWINGS

FIG. 13A is a schematic view illustrating a carrying operation that is performed by a substrate processing apparatus according to a sixth embodiment of the present invention.

DETAILED DESCRIPTION OF THE PREFERRED EMBODIMENTS

First Embodiment of the Present Invention

Hereinafter, a substrate processing apparatus according to a first embodiment of the present invention will be described with reference to the attached drawings.

(1) Configuration of Substrate Processing Apparatus

Figure 1:
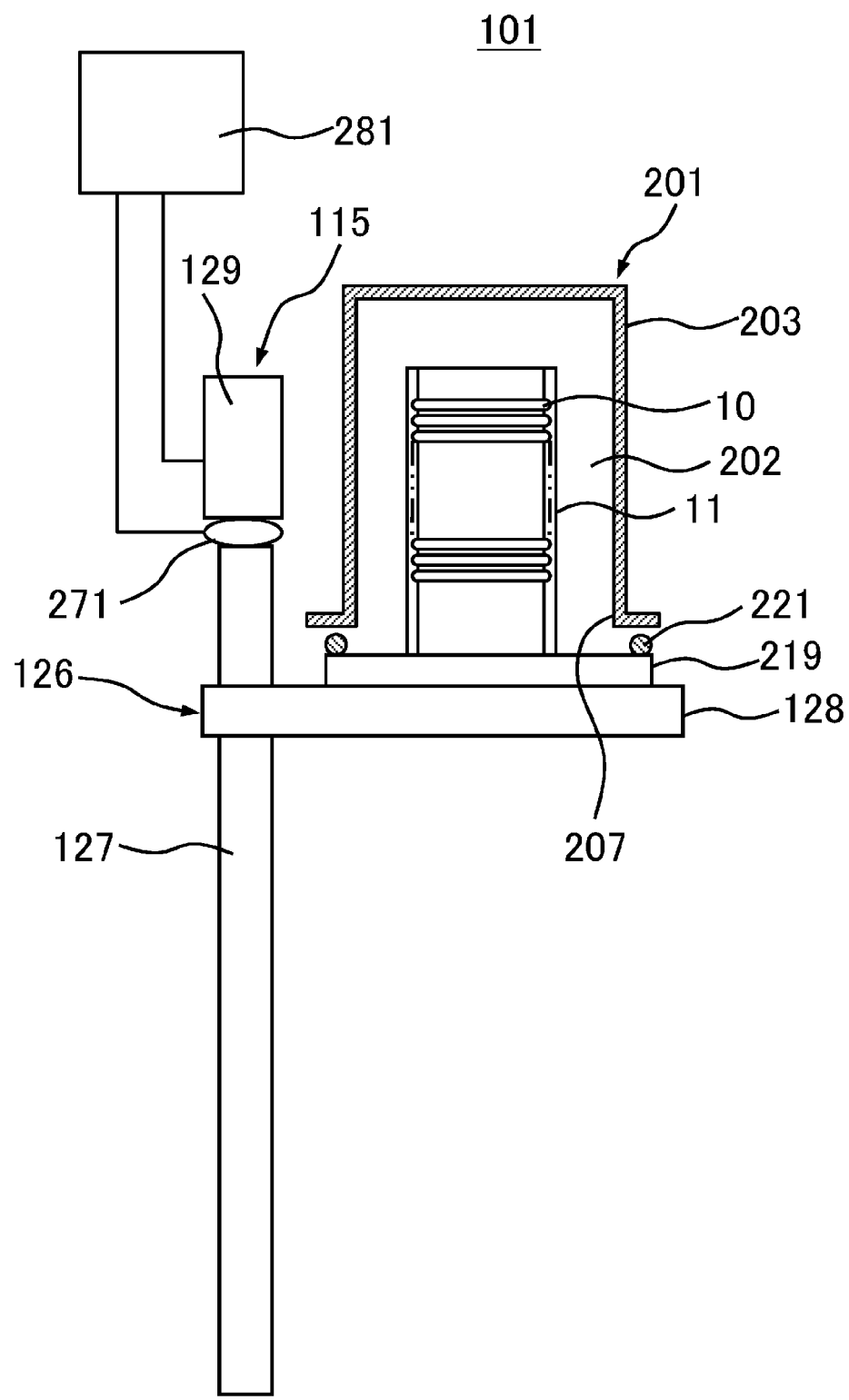
FIG. 1 is a schematic view illustrating a principal part of a substrate processing apparatus according to a first embodiment of the present invention.
Figure 2:
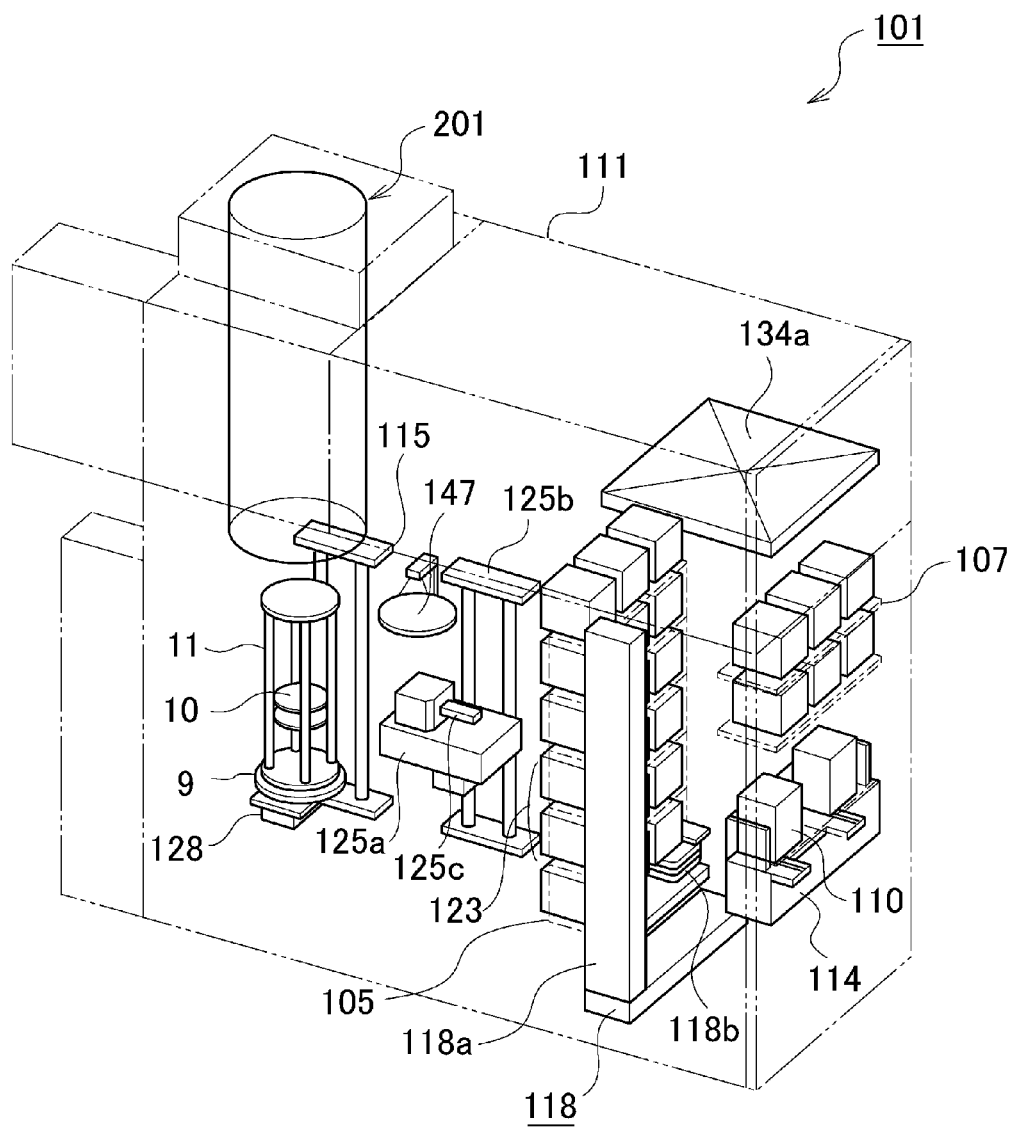
FIG. 2 is a perspective view illustrating the substrate processing apparatus according to the first embodiment of the present invention.
Figure 3:
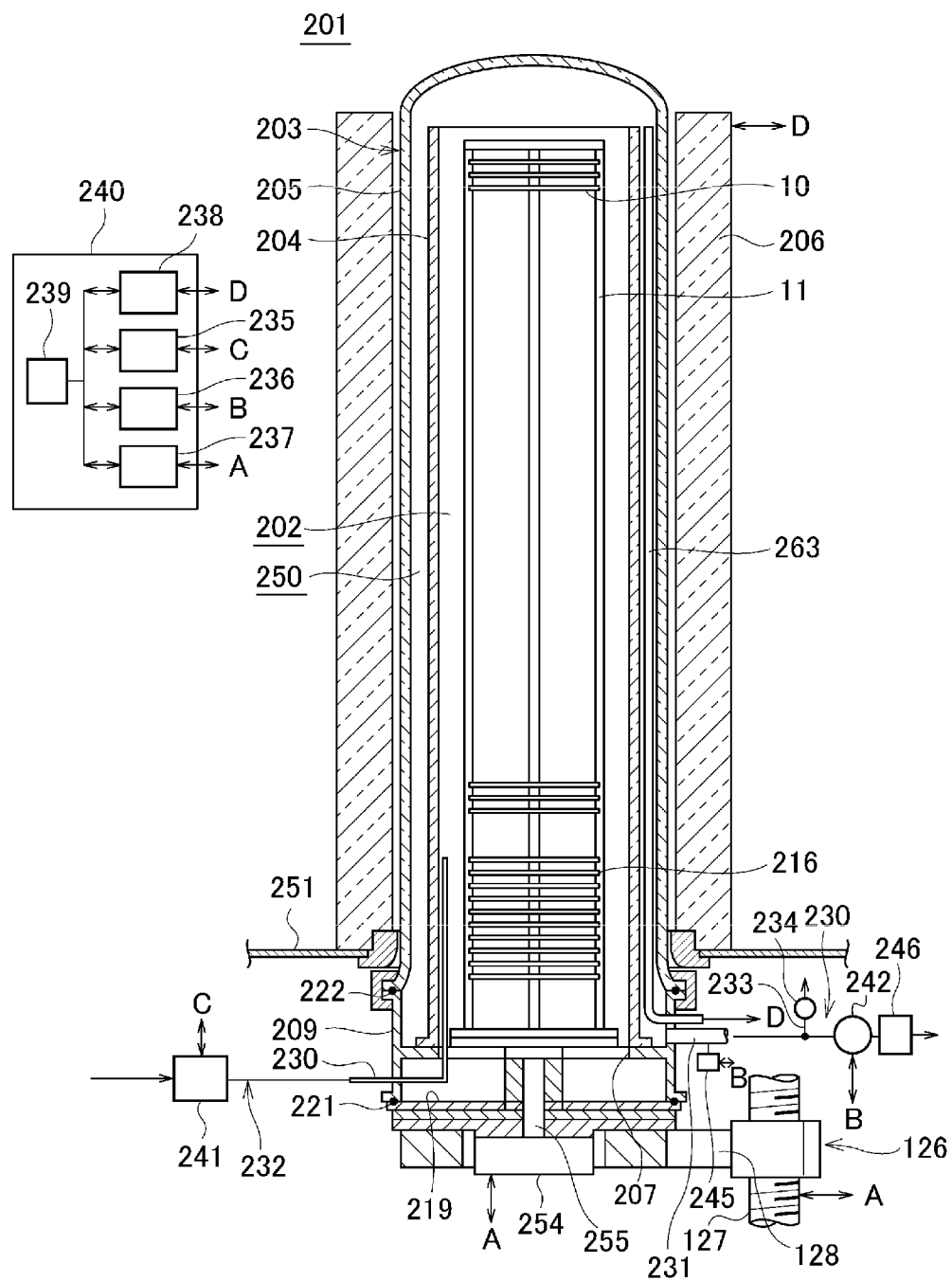
FIG. 3 is a vertical cross-sectional view illustrating an example of a process furnace of the substrate processing apparatus according to the first embodiment of the present invention.

First, an example of a configuration of a substrate processing apparatus 101 configured to perform a substrate processing process as one of processes of manufacturing a semiconductor device will now be described. FIG. 1 is a schematic view illustrating a principal part of the substrate processing apparatus 101 according to the current embodiment, and FIG. 2 is a perspective view illustrating the substrate processing apparatus 101 according to the current embodiment. FIG. 3 is a vertical cross-sectional view illustrating details of a process furnace 201 of the substrate processing apparatus 101.

As shown in FIG. 1, the substrate processing apparatus 101 according to the current embodiment includes the process furnace 201 configured to process wafers 10 as substrates. For example, the wafers 10 are silicon substrates, or may be semiconductor substrates, glass substrates, ceramic substrates, or plastic substrates, except for the silicon substrates. In the process furnace 201, a process pipe 203 provided with a process chamber 202 and including a process tube to be described later is installed, and a heater as a heating mechanism to be described later is provided to surround the process pipe 203. In addition, a boat elevator 115 as an elevation mechanism along a side part of the process furnace 201 is installed. The boat elevator 115 is configured such that an arm 128 as a support part can be moved upward and downward by a driving mechanism 126. At the upper side of the arm 128, a seal cap 219 as a cover configured to open and close a furnace port 207 installed at the lower end of the process pipe 203 is supported. At the upper side of the seal cap 219, a seal ring 221 as a sealing member configured to seal the space between the seal cap 219 and the lower end surface of the process pipe 203 is installed. For example, the seal ring 221 may be configured as an O ring. In addition, the upper surface of the seal cap 219 is configured such that a boat 11 configured to horizontally hold the wafers 10 as substrates and place the wafers 10 in multiple stages is placed on the upper surface of the seal cap 219.

For example, the driving mechanism 126 is configured as a ball screw structure, and includes a ball screw shaft 127 engaging with a nut part (not shown) installed on the arm 128, through balls, so as to vertically move the arm 128, and a guide column (not shown) configured to vertically slide the arm 128. Principally, the driving mechanism 126 according to the current embodiment is constituted by the nut part, the balls, the ball screw shaft 127, and the guide column. In addition, at the upper end (or the lower end) of the ball screw shaft 127, a motor 129 configured to rotate the ball screw shaft 127 is installed. In this way, the motor 129 is driven to rotate the ball screw shaft 127, thereby moving the arm 128 upward and downward. By the above components, the seal cap 219 and the boat 11 placed on the upper surface thereof are moved upward and downward, and the boat 11 is loaded into or unloaded out of the process chamber 202. When the boat 11 is loaded in the process chamber 202, the seal cap 219 supported by the arm 128 is pressed through the seal ring 221 toward the lower end surface the process pipe 203 by the boat elevator 115, so that the inside of the process chamber 202 is airtightly maintained.

In addition, on a driving shaft of the motor 129, a torque sensor 271 configured to measure the torque of the driving shaft is installed. In addition, on the motor 129, a controller 281 configured to control the torque of the motor 129 with a predetermined value is installed. In this way, in a recovery period of a deformation of the seal cap 219 (for example, a deformation due to a vibration) occurring when the seal ring 221 is removed from the lower end surface of the process pipe 203 or a surface of the seal cap 219, the controller 281 controls the torque of the motor 129 such that the wafers 10 are maintained at rest positions within the boat 11. For example, the torque of the motor 129 is controlled to be within a predetermined range. A detailed example of the torque control for the motor 129 will be described later. In addition, the torque control for the motor 129 through the controller 281 may be executed using a driving controller to be described later by incorporating the controller 281 into the driving controller.

Subsequently, the entire configuration of the substrate processing apparatus 101 will now be described in detail.

As shown in FIG. 2, the substrate processing apparatus 101 according to the current embodiment includes a housing 111. To carry the wafers 10 as substrates to the inside and outside of the housing 111, a cassette 110 is used as a wafer carrier (substrate container) configured to accommodate a plurality of wafers 10. At the front side within the housing 111, a cassette stage 114 functioning as a transfer stage for the cassette 110 is installed. The cassette 110 is placed on the cassette stage 114 by an in-process carrying device (not shown), and is carried out from the cassette stage 114 to the outside of the housing 111.

The in-process carrying device disposes the wafers 10 to be almost vertically oriented within the cassette 110, and places the cassette 110 on the cassette stage 114 such that a wafer taking in/out entrance of the cassette 110 to face, for example, upward. The cassette stage 114 vertically rotate the cassette 110 by 90° toward the rear side of the housing 111, so that the wafers 10 within the cassette 110 can be positioned horizontally and the wafer taking in/out entrance of the cassette 110 can face toward the rear side within the housing 111.

Near the center part of the housing 111 in a front-to-back direction, a cassette shelf 105 functioning as a rest shelf of the cassette 110 is installed. The cassette shelf 105 is configured so that a plurality of the cassettes 110 can be stored in a plurality of stages and a plurality of rows. At the cassette shelf 105, a transfer shelf 123 configured to accommodate the cassette 110 that is carried by a wafer transfer mechanism 125 is installed. In addition, at the upper side of the cassette stage 114, a preliminary cassette shelf 107 is installed and is configured to preliminarily store the cassettes 110.

Between the cassette stage 114 and the cassette shelf 105, a cassette carrying device 118 functioning as a substrate container carrying device is installed. The cassette carrying device 118 includes a cassette elevator 118a as an elevation mechanism capable of moving upward and downward while holding the cassette 110, and a cassette carrying mechanism 118b as a carrying mechanism capable of moving horizontally while holding the cassette 110. Combined operations of the cassette elevator 118a and the cassette carrying mechanism 118b carry the cassette 110 among the cassette stage 114, the cassette shelf 105, the preliminary cassette shelf 107, and the transfer shelf 123.

At the backside of the cassette shelf 105, the wafer transfer mechanism 125 is installed as a substrate transfer mechanism. The wafer transfer mechanism 125 includes a wafer transfer device 125a as a substrate transfer device configured to horizontally rotate the wafer 10 and linearly move a wafer 10, and a wafer transfer device elevator 125b as a surface transfer device elevation mechanism configured to move the wafer transfer device 125a upward and downward. In addition, the wafer transfer device 125a includes tweezers 125c as a substrate transfer part configured to horizontally hold the wafer 10. By combined operations of the wafer transfer device 125a and the wafer transfer device elevator 125b, a wafer 10 is picked up from the inside of the cassette 110 on the transfer shelf 123 and is charged to the boat 11 as a substrate holder to be described later, or a wafer 10 is discharged from the boat 11 and is accommodated into the cassette 110 on the transfer shelf 123.

At the rear upper side of the housing 111, the process furnace 201 is installed. At the lower end of the process furnace 201, an opening is installed as a furnace port (not shown). The opening is opened and closed by a furnace port shutter 147 (furnace port opening/closing mechanism) configured to open and close the furnace port. A configuration of the process furnace 201 will be described later in detail.

At the lower side of the process furnace 201, the boat elevator 115 is installed as an elevation mechanism configured to move the boat 11 upward and downward to carry the boat 11 to the inside and outside of the process furnace 201. At the boat elevator 115, the arm 128 that can be moved upward and downward is installed. At the upper side of the arm 128, the seal cap 119 as a cover configured to support the boat 11 to be oriented vertically and air-tightly seal the lower end of the process furnace 201 is installed horizontally.

The boat 11 includes a plurality of holding members, and is configured to hold a plurality of wafers 10 (for example, about fifty to one hundred fifty wafers) horizontally in a state where the centers of the wafers 10 are aligned and held in a vertical direction in multi stages. A detailed configuration of the boat 11 will be described later.

At the upside of the cassette shelf 105, a cleaning unit 134a including a supply fan and a dust filter is installed. The cleaning unit 134a is configured to circulate clean air as purified atmosphere within the housing 101.

In addition, at the left end of the housing 111 at the opposite side of the housing 111 to the wafer transfer device elevator 125b and the boat elevator 115, a cleaning unit (not shown) including a supply fan configured to supply clean air and a dust filter is installed. Clean air injected from the cleaning unit (not shown) circulates through the wafer transfer device 125a and the boat 11, and then, is introduced to an exhaust device (not shown) and is exhausted out of the housing 111.

(2) Operation of Substrate Processing Apparatus

Next, an operation of the substrate processing apparatus 101 according to the current embodiment will now be described.

First, the cassette 110 is placed on the cassette stage 114 such that the wafer 10 is disposed almost vertically by the in-process carrying device (not shown) and the wafer taking in/out entrance of the cassette 110 faces upward. After that, the cassette stage 114 vertically rotates the cassette 110 by 90° toward the rear side of the housing 111. As a result, the wafers 10 within the cassette 110 are disposed horizontally, and the wafer taking in/out entrance of the cassette 110 is directed to the rear side within the housing 111.

Next, the cassette 110 is automatically carried by the cassette carrying device 118 to a predetermined shelf position of the cassette shelf 105 or the preliminary cassette shelf 107, and is stored temporarily, and then, is transferred from the cassette shelf 105 or the preliminary cassette shelf 107 to the transfer shelf 123, or the cassette 110 is directly carried to the transfer shelf 123.

When the cassette 110 is transferred to the transfer shelf 123, the wafer 10 is picked up through the wafer taking in/out entrance from the cassette 110 by the tweezers 125c of the wafer transfer device 125a, and is charged to the boat 11 at the rear side of the transfer shelf 123 by combined operations of the wafer transfer device 125a and the wafer transfer device elevator 125b. After the wafer transfer mechanism 125 transfers the wafer 10 to the boat 11, the wafer transfer mechanism 125 is returned to the cassette 110, and charges the next wafer 10 to the boat 11.

When a predetermined sheets of wafers 10 are charged to the boat 11, the opening of the lower end of the process furnace 201 closed by the furnace port shutter 147 is opened by moving the furnace port shutter 147. Subsequently, a seal cap as a cover (not shown) is moved upward by the boat elevator 115, and thus, the boat 11 holding the wafers 10 to be processed is air-tightly loaded into the process furnace 201. After the loading of the wafers 10, a predetermined process is performed on the wafers 10 within the process furnace 201. After the predetermined process, the wafers 10 and the cassette 110 are carried out of the housing 111 in the opposite sequence to the above-described sequence.

(3) Configuration of Process Furnace

Subsequently, a configuration of the process furnace 201 of the substrate processing apparatus according to the current embodiment will now be described. FIG. 3 is a vertical cross-sectional view illustrating a process furnace of a substrate processing apparatus according to an embodiment of the present invention. In addition, the process furnace 201 according to the current embodiment is configured as a chemical vapor deposition (CVD) apparatus (batch type vertical hot wall depressurization CVD apparatus) as shown in FIG. 3.

(Process Tube)

The process furnace 201 includes a vertical process tube that is vertically disposed to have a vertical center line and is fixedly supported by the housing 111. The process tube includes an inner tube 204 and an outer tube 205. Each of the inner tube 204 and the outer tube 205 is integrally formed in a cylindrical shape with a high heat-resistant material such as quartz ($SiO_2$) or silicon carbide (SiC).

The inner tube 204 has a cylindrical shape with a close upper end and an open lower end. At the inside of the inner tube 204, the process chamber 202 configured to accommodate and process the wafers 10 horizontally oriented and stacked in multiple stages by the boat 11 as a substrate holder is disposed. The open lower end of the inner tube 204 constitutes the furnace port 207 through which the boat 11 holding the wafers 10 is loaded and unloaded. Thus, the inner diameter of the inner tube 204 is designed to be greater than the maximum outer diameter of the boat 11 holding the wafers 10. The outer tube 205 has a cylindrical shape with a close upper end and an open lower end, and a side wall part of the outer tube 205 is greater than the inner tube 204, for example, is formed in the similar shape to that of the inner tube 204. That is, when viewed from the upper side, the outer tube 205 concentrically covers the inner tube 204 to surround the outside of the inner tube 204. The space between the lower end of the inner tube 204 and the lower end of the outer tube 205 is air-tightly sealed by a manifold 209 having a ring shape. In addition, the space between the lower end of the outer tube 205 and the upper outer circumferential part of the manifold 209 is air-tightly sealed by a seal ring 222. The manifold 209 is removably installed on the inner tube 204 and the outer tube 205 to facilitate a maintenance checking process or a cleaning process on the inner tube 204 and the outer tube 205. The manifold 209 is supported by the housing 111 (refer to FIG. 2), and thus, the process tube is vertically installed. Thus, the process tube configured by the inner tube 204 and the outer tube 205, and the manifold 209 constitute the process pipe 203.

(Exhaust Unit)

A part of the side wall of the manifold 209 is connected with an exhaust system 230 configured to exhaust gas from the process chamber 202. The exhaust system 230 is disposed at the lower end of an exhaust passage 250 having a barrel shaped space that is formed by the gap between the inner tube 204 and the outer tube 205, and an exhaust pipe 231 constituting the exhaust system 230 communicates with the inside of the exhaust passage 250. At the exhaust pipe 231, sequentially from the upstream side of the exhaust pipe 231, a pressure sensor 245, an auto pressure controller (APC) valve 242 as a pressure adjustment valve, and a vacuum pump 246 as a vacuum exhaust device are installed. The vacuum pump 246 is configured to evacuate the process chamber 202 such that the inner pressure of the process chamber 202 reaches a predetermined pressure (degree of vacuum). The APC valve 242 and the pressure sensor 245 are electrically connected to a pressure controller 236. The pressure controller 236 is configured to control the degree of opening of the APC valve 242 based on a pressure value detected using the pressure sensor 245 to maintain the inner pressure of the process chamber 202 at a desired pressure at a desired time. Principally, the exhaust pipe 231, the exhaust passage 250, the pressure sensor 245, the APC valve 242, and the vacuum pump 246 constitute an exhaust unit according to the current embodiment. In addition, the upstream side of the APC valve 242 of the exhaust system 230 is connected with an excessive pressure prevention line 233 configured to perform an excessive pressure prevention process. The excessive pressure prevention line 233 is connected with an excessive pressure prevention valve 234. When the inner pressure of the process chamber 202 reaches an excessive pressure, and the excessive pressure is detected by the pressure sensor 245, the pressure controller 236 opens the excessive pressure prevention valve 234 to remove an excessive pressure state of the process chamber 202.

(Substrate Holding Unit)

At the lower side of the manifold 209, the seal cap 219 is installed as a cover configured to open and close the open lower end of the manifold 209. The seal cap 219 has a circular plate shape with an outer diameter equal to or greater than the outer diameter of the open lower end of the manifold 209, and the outer circumference of the upper surface of the seal cap 219 is provided with the seal ring 221 as a sealing member that can closely contact the lower end surface of the manifold 209. For example, the seal ring 221 is configured as an O ring. In addition, by the boat elevator 115 as an elevation mechanism vertically installed at the outside of the process pipe 203, the seal cap 219 is vertically moved with a rest surface of the boat 11 in a horizontal state. Thus, in the state where the seal cap 219 raised by the boat elevator 115 is pressed through the seal ring 221 against the lower surface of the manifold 209, the open lower end of the manifold 209 is sealed, and thus, the process chamber 202 becomes airtight.

(Boat Elevator)

For example, the boat elevator 115 as described above includes the arm 128 configured to support the seal cap 219 from the lower surface thereof, the guide column (not shown) configured to vertically guide the upward and downward moving of the arm 128, and the driving mechanism 126 configured to vertically move the arm 128 along the guide column. For example, the driving mechanism 126 is configured in a ball screw structure, and includes, for example, the nut part (not shown) installed on the arm 128 and the ball screw shaft 127 engaging with the nut part through the balls (not shown). In addition, at the upper end (or the lower end) of the ball screw shaft 127, the motor 129 (refer to FIG. 1) configured to rotate the ball screw shaft 127 is installed. In this way, the motor 129 is driven to rotate the ball screw shaft 127 in a predetermined direction, thereby moving the arm 128 upward and downward.

At the upper side of the seal cap 219, the boat 11 as a substrate holding unit configured to hold the wafer 10 vertically stands and is supported. The boat 11 is made of a heat-resistant material, for example, such as quartz ($SiO_2$) or silicon carbide (SiC), and is configured to hold a plurality of wafers 10 to be horizontally oriented in a state where the centers of the wafers 10 are aligned in multi stages. In addition, at the lower side of the boat 11, insulating plates 216 as a thermally insulating member having a circular plate shape with a heat resistant material, for example, such as quartz or silicon carbide are horizontally oriented in multi stages. The insulating plates 216 are configured to suppress the heat transfer from a heater 206 to the manifold 209.

At the opposite side of the seal cap 219 to the process chamber 202, a rotation mechanism 254 configured to rotate the boat 11 is installed. A rotation shaft 255 of the rotation mechanism 254 passes through the seal cap 219 to support the boat 11 from the lower side. The rotation shaft 255 is rotated, so that the wafers 10 can be rotated within the process chamber 202. The seal cap 219 is vertically moved by the boat elevator 115, and thus, the boat 11 can be loaded into the process chamber 202 and unloaded from the process chamber 202.

The rotation mechanism 254 and the boat elevator 115 are electrically connected with a driving controller 237. The driving controller 237 is configured to control the rotation mechanism 254 and the motor 129 of the boat elevator 115 to be desirably operated at a desired time.

(Heater Unit)

At the outside of the outer tube 205, the heater 206 as a heating mechanism configured to entirely and uniformly heat the inside of the process pipe 203 or heat the inside of the process pipe 203 to a predetermined temperature distribution is installed in a manner of surrounding the outer tube 205. The heater 206 is supported by a heater base 251 installed in the housing 111 (refer to FIG. 2) of the substrate processing apparatus 101, so that the heater 206 is vertically installed, and the heater 206 is configured as a resistance heater, for example, such as a carbon heater.

A temperature sensor 263 is installed as a temperature detector within the process pipe 203. The heater 206 and the temperature sensor 263 are electrically connected with a temperature controller 238. The temperature controller 238 is configured to control an electrified state of the heater 206 based on temperature information detected using the temperature sensor 263 such that the inside of the process chamber 202 has a desired temperature distribution at a desired time.

Principally, the heater 206 and the temperature sensor 263 constitute a heater unit.

(Process Gas Supply Unit)

A gas supply nozzle 230 is held by the manifold 209, and vertically stands within the process chamber 202, and supplies process gas into the process chamber 202. The gas supply nozzle 230 may be an L-shape gas supply nozzle in which an end disposed at the downstream side thereof vertically stands, or be a straight type gas supply nozzle (not shown). The gas supply nozzle 230 is made of a heat resistant non-metal material such as quartz. In addition, an end of the gas supply nozzle 230 at the upstream side thereof protrudes out of the process furnace 201, and is connected to a gas supply pipe 232 configured to supply process gas into the process chamber 202 through the gas supply nozzle 230. In addition, the upstream side of the gas supply pipe 232 is connected with a process gas supply source (not shown) or an inert gas supply source (not shown) through a mass flow controller (MFC) 241 as a gas flow rate controller. The mass flow controller 241 is electrically connected with a gas flow rate controller 235. The mass flow controller 241 is configured to control the flow rate of gas supplied into the process chamber 202 to a desired amount at a desired time. A process gas supply unit configured to supply process gas into the process chamber 202 through the mass flow controller 241, the gas supply pipe 232, and the gas supply nozzle 230 may be installed as a plurality of systems. For example, the systems may be a system configured to supply source gas, a system configured to supply gas including an additive, and a system configured to supply diluent gas.

(Controller)

The gas flow rate controller 235, the pressure controller 236, the driving controller 237, and the temperature controller 238 are electrically connected to a main controller 239 including a manipulation part having a display part and an input/output part and configured to entirely control the substrate processing apparatus. The gas flow rate controller 235, the pressure controller 236, the driving controller 237, the temperature controller 238, and the main controller 239 are configured as a controller 240.

(4) Substrate Processing Process

Figure 4:
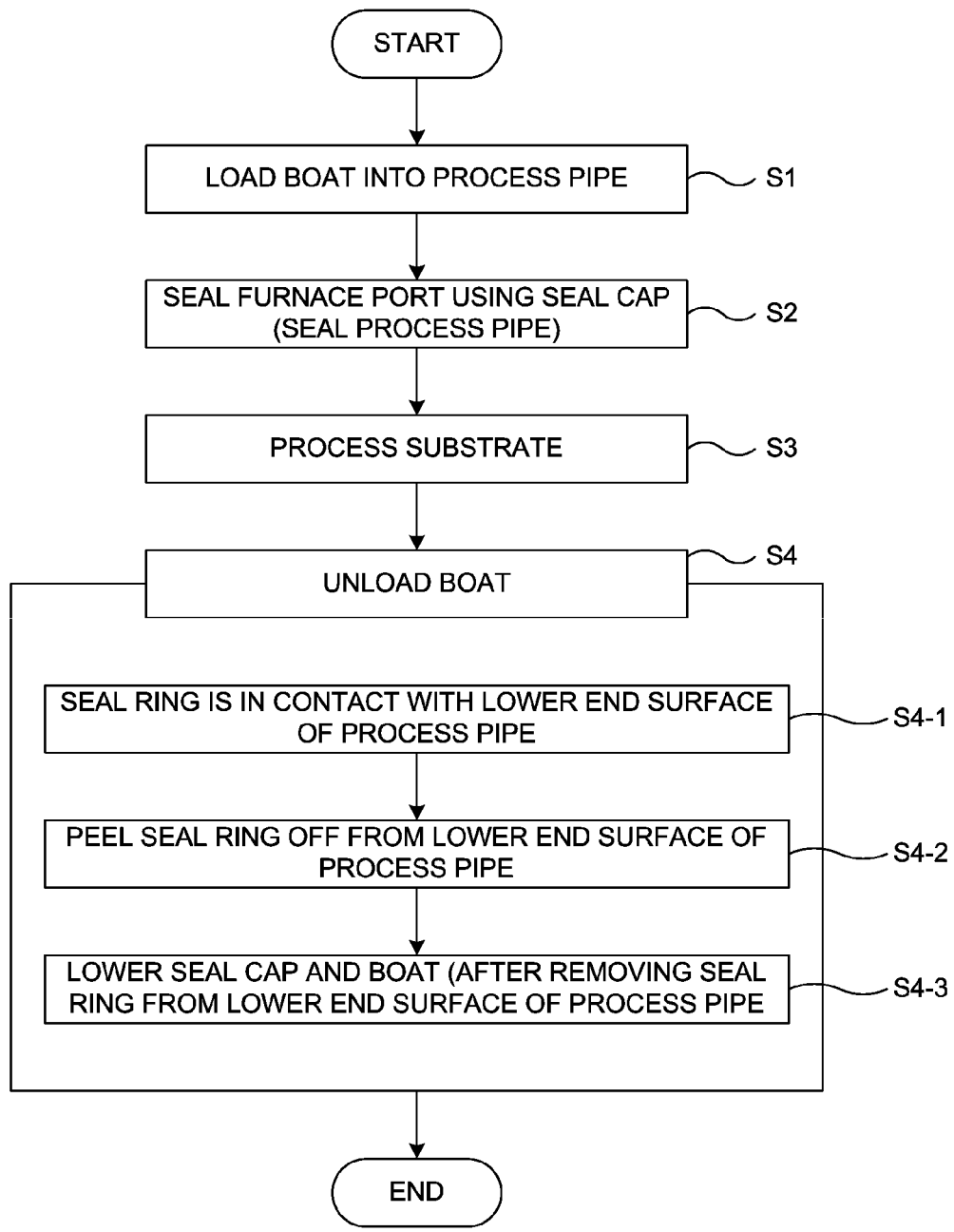
FIG. 4 is a flowchart illustrating a process of a method of manufacturing a semiconductor device according to the first embodiment of the present invention.

Next, one of processes of manufacturing a semiconductor device performed by the substrate processing apparatus 101 as described above will now be described with reference to the flowchart of FIG. 4.

First, the boat 11 unloaded from the process pipe 203 is charged with a plurality of the wafers 10 (wafer charging). In this way, the boat 11 accommodates a plurality of the wafers 10, for example, one hundred wafers 10 having a diameter of 300 mm on which thin films are formed. When the charging of the wafers 10 is ended, the boat 11 holding the wafers 10 is moved upward using the boat elevator 115 and is loaded into the process chamber 202 (boat loading) (the loading of the boat into the process pipe: S1). In this state, the lower end surface of the manifold 209 is sealed through the seal ring 221 by the seal cap 219, and the inside of the process pipe 203 is airtight (the airtight inside of the process pipe: S2).

When the loading of the wafers 10 into the process chamber 202 is ended, the process chamber 202 is evacuated using the vacuum pump 246 such that the inner pressure of the process chamber 202 reaches a desired pressure (degree of vacuum), so as to discharge the inner atmosphere of the process chamber 202. At this time, the inner pressure of the process chamber 202 is measured using the pressure sensor 245. Based on the measured inner pressure, the degree of opening of the APC valve 242 is feedback controlled. In addition, the inside of the process chamber 202 is heated using the heater 206 such that the inner temperature of the process chamber 202 reaches a desired temperature. In addition, the electrified state of the heater 206 is feedback controlled based on temperature information detected using the temperature sensor 263 such that the inside of the process chamber 202 has a desired temperature distribution. Subsequently, the boat 11 is rotated using the rotation mechanism 254, so that the wafers 10 are rotated.

After that, process gas is supplied into the process chamber 202, and a film forming process is performed on the wafers 10. That is, process gas supplied from the process gas supply source (not shown) and controlled to have a desired flow rate at the MFC 241 is supplied from the gas supply pipe 232 and is introduced through the gas supply nozzle 230 into the process chamber 202. The introduced process gas moves upward within the process chamber 202, and is discharged from the open upper end of the inner tube 204 into the exhaust passage 250, and is exhausted from the exhaust system 230. When passing through the process chamber 202, the process gas contacts the surfaces of the wafers 10, and thin films are deposited on the surfaces of the wafers 10, for example, by a thermal CVD reaction (substrate processing process: S3).

When the forming of the thin film is ended, an after-purge process is performed. That is, inert gas is supplied from the gas supply pipe 232 through the gas supply nozzle 230 into the process chamber 202. In addition, at this time, a vacuum exhaust process is performed using the vacuum exhaust device 246. As a result, the inner atmosphere of the process chamber 202 is purified by the inert gas.

When the after-purge process is ended, an atmosphere return process is performed. That is, the vacuum exhaust process is stopped, and only the inert gas is supplied. As a result, the inner atmosphere of the process chamber 202 is returned to a normal pressure.

When the atmosphere return process is ended, a boat unloading process is performed. That is, the seal cap 219 is moved downward using the boat elevator 115 to open the furnace port 207 disposed at the lower end of the manifold 209, and simultaneously, the wafers 10 placed on the boat 11 after the film forming process are unloaded from the furnace port 207 disposed at the lower end of the manifold 209 to the outside of the process pipe 203 (boat unloading: S4). After that, the processed wafers 10 are discharged from the boat 11 (wafer discharging) to end a first batch process. In the same manner, also in a second batch process and the following processes, the above described processes are performed on wafers 10 to be processed.

Here, the boat unloading S4 for the boat 11 will now be described in detail.

(Step S4-1)

When the above-described substrate processing process S3 is ended, just after the inside of the process chamber 202 returns to the atmosphere, the boat elevator 115 presses the seal cap 219 through the seal ring 221 against the lower end surface of the process pipe 203 (substantially, the manifold 209). At this time, the motor 129 is driven in a direction that the arm 128 is moved upward, to output torque of pressing the seal ring 221 (the seal ring closely contacts the lower end surface of the process pipe: S4-1). At this time, the torque is, for example, −37% of a rated torque of the motor 129. Hereinafter, when the torque of the motor 129 is negative (−), the motor 129 is driven in the direction (upward) that the seal cap 219 is pressed through the seal ring 221 against the lower end surface of the process pipe 203. In addition, when the torque of the motor 129 is positive (+), the motor 129 is driven in the direction (downward) that the seal cap 219 closely contacting the lower end surface of the process pipe 203 through the seal ring 221 is removed.

From the state in which the seal ring 221 closely contacts the lower end surface of the process pipe 203, the motor 129 is driven in the direction that the rotation direction of the motor 129 is reversed to move the seal cap 219 downward. At this time, the controller 281 controls the torque of the motor 129 such that the wafers 10 are maintained at the rest positions within the boat 11 in a recovery period of a deformation of the seal cap 219 (for example, of a vibration) occurring when the seal ring 221 is removed from the lower end surface of the process pipe 203 or the surface of the seal cap 219. Simultaneously, the torque of the motor 129 is set to a torque value capable of removing the seal ring 221 from the lower end surface of the process pipe 203. Hereinafter, a case where the seal ring 221 is fixed to the seal cap 219 and the seal ring 221 closely contacts the lower end surface of the process pipe 203 will be described. As a matter of course, on the contrary, even in a case where the seal ring 221 is fixed to the lower end surface of the process pipe 203 and the seal ring 221 closely contacts the seal cap 219, the torque of the motor 129 can be controlled in the same manner.

Just after the driving of the motor 129 is started in the direction that the seal cap 219 is moved downward, an adhered state of the seal ring 221 to the lower end surface of the process pipe 203 is maintained. Simultaneously, by tensile force due to the downward operation of the seal cap 219 using the boat elevator 115, the seal ring 221 is extended to the vertical lower side. In this state, the torque of the motor 129 increases. In addition, since the torque of the motor 129 is limited by an upper limit, the torque of the motor 129 increases up to the upper limit. The upper limit is determined as a torque value that, in the recovery period of a deformation of the seal cap 219 (for example, a vibration) occurring when removing the seal ring 221 from the lower end surface of the process pipe 203 (or the surface of the seal cap 219), the wafers 10 are not suspended when viewed from wafer rest positions within the boat 11 and the wafers 10 are maintained at the wafer rest positions within the boat 11.

Alternatively, for example, the upper limit of the torque of the motor 129 is set such that, in the recovery period when a deformation (vibration) of the seal cap 219 is returned to an original state, an acceleration applied to the boat 11 is equal to or less than the acceleration of gravity. That is, to remove the wafer 10 placed within the boat 11 such that the wafer 10 is suspended from the rest position thereof, it is necessary that the boat 11 is lowered more quickly than the wafer 10. Thus, when the acceleration (downward acceleration) applied to the boat 11 is greater than the acceleration of gravity, the wafer 10 is suspended from the boat 11 when viewed from the boat 11. Thus, the acceleration applied to the boat 11 is controlled to be equal to or less than the acceleration of gravity, so as to prevent the suspension of the wafer 10 from the boat 11 when viewed from the wafer rest position of the boat 11.

(Step S4-2)

Then, until reaching the set upper limit of the torque, the seal cap 219 is continually extended downward by the boat elevator 115, and simultaneously, the seal ring 221 is also continually extended downward. In addition, even before reaching the set upper limit of the torque, when force of extending the seal ring 221 downward is greater than adhering force of the seal ring 221 to the lower end surface of the process pipe 203, the seal ring 221 is removed from the lower end surface of the process pipe 203 (peeling off of the seal ring from the lower end surface of the process pipe S4-2).

(Another Example of Step S4-2)

In addition, during the downward operation of the seal cap 219 using the boat elevator 115, although the torque of the motor 129 reaches the set upper limit, even when the seal ring 221 is not removed, the motor 129 is driven at the upper limit of the torque and the seal cap 219 is continually extended downward by the boat elevator 115. At this time, the seal ring 221 is continually moved downward together with the seal cap 219. Then, when the seal ring 221 is continually extended, the seal ring 221 closely contacting the lower end surface of the process pipe 203 is gradually peeled off, so that extension force of the seal ring 221 is greater than the adhering force of the seal ring 221 at a point after a predetermined period, and thus, the seal ring 221 is removed from the lower end surface of the process pipe 203 (peeling off of the seal ring from the lower end surface of the process pipe: S4-2).

At this time, since the motor 129 is driven to be limited to the set upper limit of the torque, just when the seal ring 221 is removed from the lower end surface of the process pipe 203, the torque greater than the set upper limit does not occur. Thus, even when the seal cap 219 is deformed to cause a vibration, the deformation of the seal cap 219 is disposed within a range that the wafer 10 is maintained at the rest position within the boat 11.

(Step S4-3)

Then, after the seal ring 221 is removed, the motor 129 is driven with the torque of the set upper limit or less, and the seal cap 219 is lowered by the boat elevator 115 (the lowering of the seal cap and the boat (after the seal ring is removed from the lower end surface of the process pipe): S4-3). Thus, when the seal ring 221 is removed from the lower end surface of the process pipe 203 or the surface of the seal cap 219, the wafers 10 are maintained at the rest positions within the boat 11.

In addition, the controller 281 can execute a control such that the torque of the motor 129 of pressing the seal ring 221 just before starting the operation that the seal ring 221 is removed from the lower end surface of the process pipe 203 or the surface of the seal cap 219 is smaller than the torque of the motor 129 when the seal ring 221 is pressed on the lower end surface of the process pipe 203 and the surface of the seal cap 219.

In addition, the controller 281 may be configured to control the torque of the motor 129 such that the wafers 10 are maintained at the rest positions within the boat 11 in the recovery period of a deformation of the arm 128 (for example, a vibration) occurring when the seal ring 221 is removed from the lower end surface of the process pipe 203 or the surface of the seal cap 129.

In addition, the controller 281 may control the torque of the motor 129 to be varied in time series when the seal ring 221 is removed from the lower end surface of the process pipe 203 or the surface of the seal cap 219.

(5) Effects According to the Current Embodiment

According to the current embodiment, one or more following effects are obtained.

(a) The controller 281 according to the current embodiment controls the torque of the motor 129 such that the wafers 10 placed within the boat 11 are maintained at the rest positions when the seal ring 221 adhered to the lower end surface of the process pipe 203 or the surface of the seal cap 219 is removed therefrom. Thus, in the state where the seal ring 221 is adhered to the lower end surface of the process pipe 203 or the surface of the seal cap 219, the seal cap 219 starts to be moved downward, so that a cross section of the seal cap 219 is deformed in a manner of extension; and when the seal ring 221 is removed from the lower end surface of the process pipe 203, although a vibration (damped vibration) of the seal cap 219 due to the tendency of the deformation recovery of the seal cap 219 is transmitted to the boat 11, the suspension of the wafers 10 when viewed from the wafer rest positions (substrate rest positions) is prevented, and thus, the boat 11 can be unloaded from the inside of the process pipe 203 in the state where the wafers 10 are stably placed.

(b) In addition, in the initial stage of the deformation recovery period of the seal cap 219, the wafers 10 may be suspended from the wafer rest positions (substrate rest positions), and thus, it is preferable to control the torque of the motor 129 only in the initial stage of the deformation recovery period of the seal cap 219 to prevent the suspension of the wafers 10. In the rest stage except for the initial stage, that is, after the seal ring 221 is removed from the lower end surface of the process pipe 203 (the manifold 209), instead of controlling the torque of the motor 129, for example, the torque of the motor 129 can be decreased to increase a movement velocity. In this way, the throughput in unloading the boat 11 from the process pipe 203 can be improved.

(c) The controller 281 can execute the control such that the torque of the motor 129 of pressing the seal ring 221 just before starting the operation that the seal ring 221 is removed from the lower end surface of the process pipe 203 or the surface of the seal cap 219 is smaller than the torque of the motor 129 when the seal ring 221 is pressed on the lower end surface of the process pipe 203 and the surface of the seal cap 219. In this way, just before the operation of moving the seal cap 219 downward, the adhering force of the seal ring 221 to the lower end surface of the process pipe 203 or the surface of the seal cap 219 can be decreased, and thus, the seal ring 221 can be easily removed from the lower end surface of the process pipe 203 or the surface of the seal cap 219. Thus, in the state where the torque of the motor 129 is small, the seal ring 221 can be removed from the lower end surface of the process pipe 203 or the surface of the seal cap 219.

(d) In the configuration that the controller 281 controls the torque of the motor 129 such that the wafers 10 are maintained at the rest positions within the boat 11 in a recovery period of a deformation (for example, a vibration) of the arm 128, the boat 11 and the seal cap 219 start to be moved downward in the state where the seal ring 221 is adhered to the lower end surface of the process pipe 203 or the surface of the seal cap 219, and thus, the arm 128 configured to support the seal cap 219 may be deformed, and the deformed arm 128 may return to the original state when the seal ring 221 is removed from the lower end surface of the process pipe 203 or the surface of the seal cap 219. A vibration (damped vibration) of the arm 128 occurring when the arm 128 recovers from the deformation state is transmitted to the boat 11 through the seal cap 219. At this time, since the controller 281 controls the torque of the motor 129 such that the wafers 10 are maintained at the rest positions within the boat 11, the suspension of the wafers 10 when viewed from the rest positions of the wafers 10 is prevented, so that the boat 11 with the wafers 10 being stably placed can be unloaded from the inside of the process chamber 202 of the process pipe 203.

(e) The torque of the motor 129 is varied in time series, for example, is controlled to be increased in time series, thereby gradually decreasing the adhering force of the seal ring 221 to the lower end surface of the process pipe 203, which makes it possible to remove the seal ring 221. In this way, without the vibration and suspension of the wafers 10 from the rest positions of the wafers 10 of the boat 11 placed on the seal cap 219, the seal ring 221 can be removed from the lower end surface of the process pipe 203. However, it is necessary that the period of varying the torque of the motor 129 in time series is limited below an excessively long period, for example, a time monitoring process is performed such that the period of increasing the torque of the motor 129 in time series is limited, for example, to 20 seconds or less, thereby preventing a significant reduction of the throughput. Especially, for example, this is effective in a case where the adhering force of the seal ring 221 to the lower end surface of the process pipe 203 is increased by heat and by-products generated from a wafer process, or in a case where an upper limit of the torque of the motor 129 is set and the removing of the seal ring 221 is difficult at the upper limit of the torque.

First Embodiment

In the substrate processing apparatus 101 according to the current embodiment, the controller 281 controls the torque output from the motor 129 to a predetermined upper limit or less. In this way, when removing the seal ring 221 from the lower end surface of the process pipe 203, to maintain the wafers 10 at the rest positions within the boat 11, the torque output from the motor 129 is controlled to the predetermined upper limit or less. In this case, a graph illustrating a relationship between an elapsed time and a position of the seal cap 219, a graph illustrating a relationship between an elapsed time and a movement velocity of the seal cap 219, and a graph illustrating a relationship between an elapsed time and a torque ratio of the motor 129 are shown in FIG. 5.

The vertical axis of the upper one of the graphs denotes a movement amount of the seal cap 219 from the position of the seal cap 219 when the process pipe 203 is air-tightly sealed. The vertical axis of the middle graph denotes a downward movement velocity of the seal cap 219. The vertical axis of the lower graph denotes a ratio (torque ratio) of an output torque to a rated torque of the motor 129 in percent. On the vertical axis denoting a torque ratio, the torque ratio of the motor 129 when driving the motor 129 in the direction of moving the seal cap 219 downward is positive (+), and the torque ratio of the motor 129 when driving the motor 129 in the direction of moving the seal cap 219 upward is negative (−). In addition, the horizontal axis of each graph denotes an elapsed time. In addition, also in subsequent graphs illustrating a relationship between an elapsed time and a position of the seal cap 219, subsequent graphs illustrating a relationship between an elapsed time and a movement velocity of the seal cap 219, and subsequent graphs illustrating a relationship between an elapsed time and a torque ratio of the motor 129, vertical axes and horizontal axes are the same as the above-described vertical axis and horizontal axis.

Figure 5:
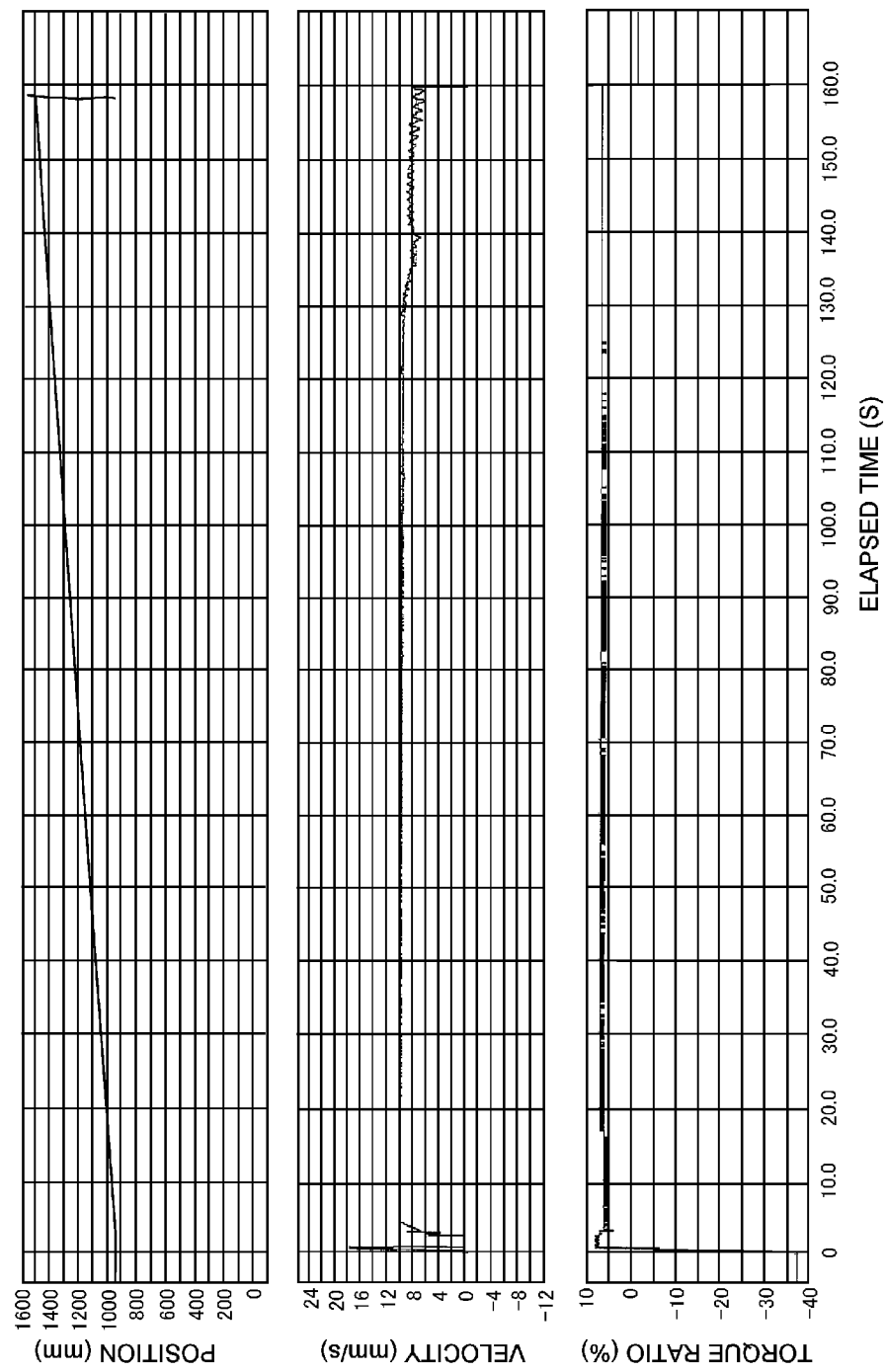
FIG. 5 is a view illustrating, in a case of limiting an upper limit of a torque ratio of a motor, a graph illustrating a relationship between an elapsed time and a position of a seal cap, a graph illustrating a relationship between an elapsed time and a movement velocity of the seal cap, and a graph illustrating a relationship between an elapsed time and a torque ratio of the motor.

As shown in FIG. 5, the controller 281 limits an upper limit of the output torque of the motor 129 to a torque ratio of 8%. The upper limit is set as a torque ratio that, just when the seal ring 221 is removed from the lower end surface of the process pipe 203, the boat 11 placed on the upper surface of the seal cap 219 or the wafers 10 placed on the boat 11 are not suspended when viewed from a position where the surface of the seal cap 219 is determined as a reference. In addition, the upper limit of the torque ratio is appropriately selected and determined according to a rated output of the motor 129, and the weights of the boat 11, the seal ring 221, and the arm 128. When removing the seal ring 221 closely contacting the lower end surface of the process pipe 203, if the motor 129 outputs torque, the torque is maintained for about 2 seconds at the upper limit, and then, the seal ring 221 is removed from the lower end surface of the process pipe 203. At this time that the seal ring 221 is removed from the lower end surface of the process pipe 203, even when a downward acceleration is applied to the seal cap 219, at the torque ratio set to the upper limit, the boat 11 placed on the upper surface of the seal cap 219 or the wafers 10 placed on the boat 11 are not suspended when viewed from the position where the surface of the seal cap 219 is determined as a reference. After removing the seal ring 221 closely contacting the lower end surface of the process pipe 203, the torque output of the motor 129 corresponds to the torque ratio of 8% or less, and the seal cap 219 and the boat 11 placed thereon are moved downward are unloaded from the process chamber 202 of the process pipe 203. As shown in the graph illustrating a relationship between a torque ratio and an elapsed time, the seal cap 219 is moved downward with a torque ratio ranging from about 6% to about 7%. At this point, as shown in the graph illustrating a relationship between a position and an elapsed time and the graph illustrating a relationship between a movement velocity and an elapsed time, the seal cap 219 is lowered substantially at a constant speed. As such, when the output torque from the motor 129 corresponds to the torque ratio ranging from about 6% to about 7%, the seal cap 219 on which the boat 11 accommodating the wafers 10 is placed can be lowered at a high speed. Thus, a torque ratio of the output torque of the motor 129 is set to 8% or less to suppress the vibration when removing the seal ring 221, so that the boat 11 can be unloaded at a high speed.

Second Embodiment

Figure 6:
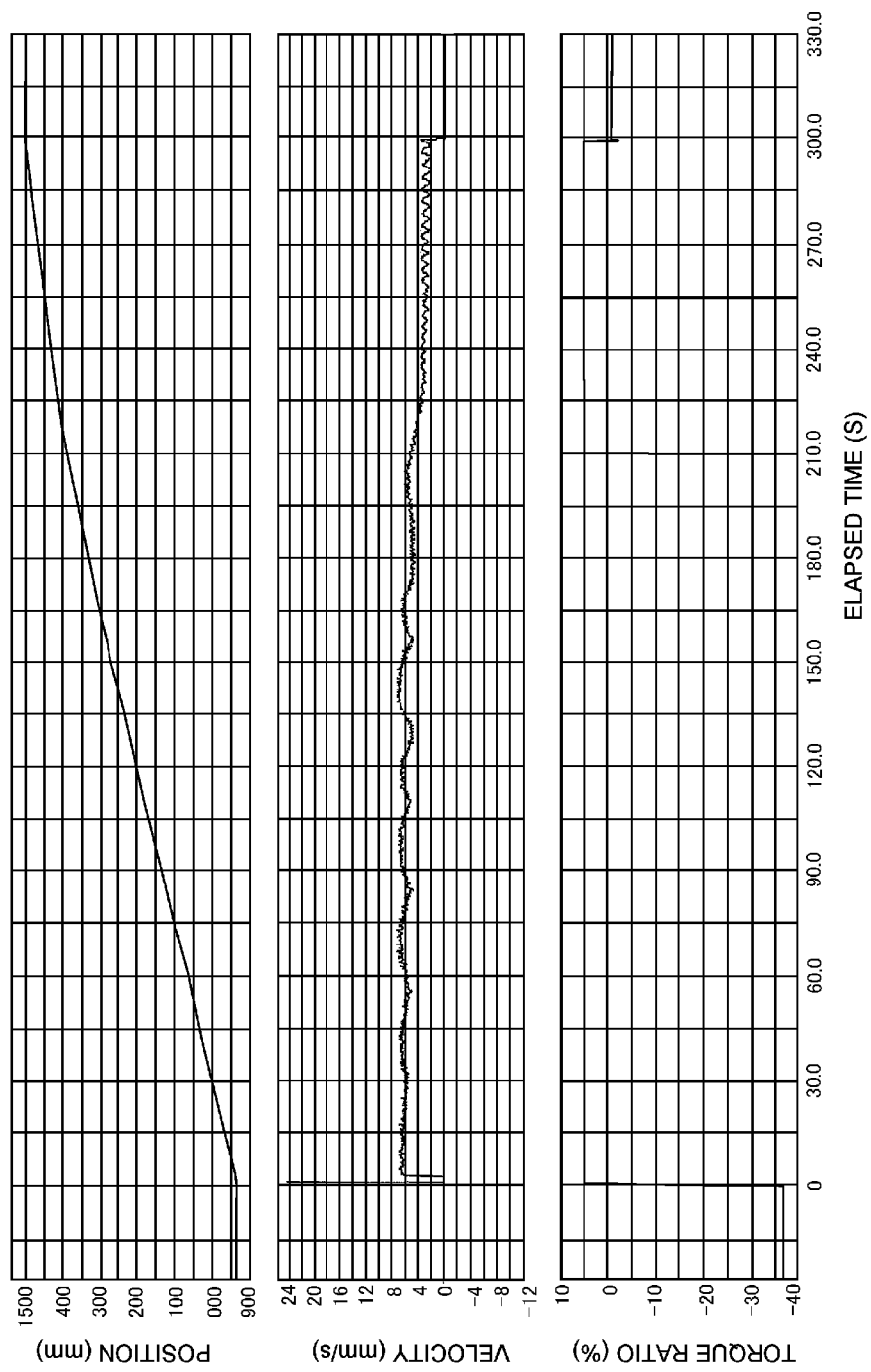
FIG. 6 is a view illustrating, in a case of limiting an upper limit of a torque ratio of a motor, a graph illustrating a relationship between an elapsed time and a position of a seal cap, a graph illustrating a relationship between an elapsed time and a movement velocity of the seal cap, and a graph illustrating a relationship between an elapsed time and a torque ratio of the motor.

Next, a case where the upper limit of the torque value of the motor 129 is limited to 5% will now be described with reference to FIG. 6. As shown in FIG. 6, when the upper limit of the torque value of the motor 129 is set to a lower value, for example, to a torque ratio of 5%, 2 to 3 seconds elapse until the seal ring 221 is removed from the lower end surface of the process pipe 203, and further, an operation time elapses after the removing of the seal ring 221. In this case, it takes 298 seconds to completely unload the boat 11 from the inside of the process chamber 202 of the process pipe 203. In addition, when the output torque of the motor 129 corresponds to the small torque ratio of 5%, after the seal ring 221 is removed from the lower end surface of the process pipe 203, a movement velocity when the boat 11 is lowered together with the seal cap 219 is not constant, and a small variation and a great variation are repeated. As such, when the speed of the boat 11 varies during the downward moving of the boat 11, the wafers 10 accommodated in the boat 11 may be removed form the rest positions thereof. Furthermore, in the worst case, the force of removing the seal ring 221 may be decreased, and the seal ring 221 may not be removed from the lower end surface of the process pipe 203. Thus, it is not preferable to set the torque ratio of the motor 129 to an excessive small value. For example, it is necessary to set the torque ratio of the motor 129 to a greater value than 5%. However, when the upper limit of the torque value is set to a small value, a deformation amount of the seal cap 219 when the removing of the seal ring 221 can be decreased, and thus, a vibration suppression effect is improved, which will be easily appreciated.

Third Embodiment

Figure 7:
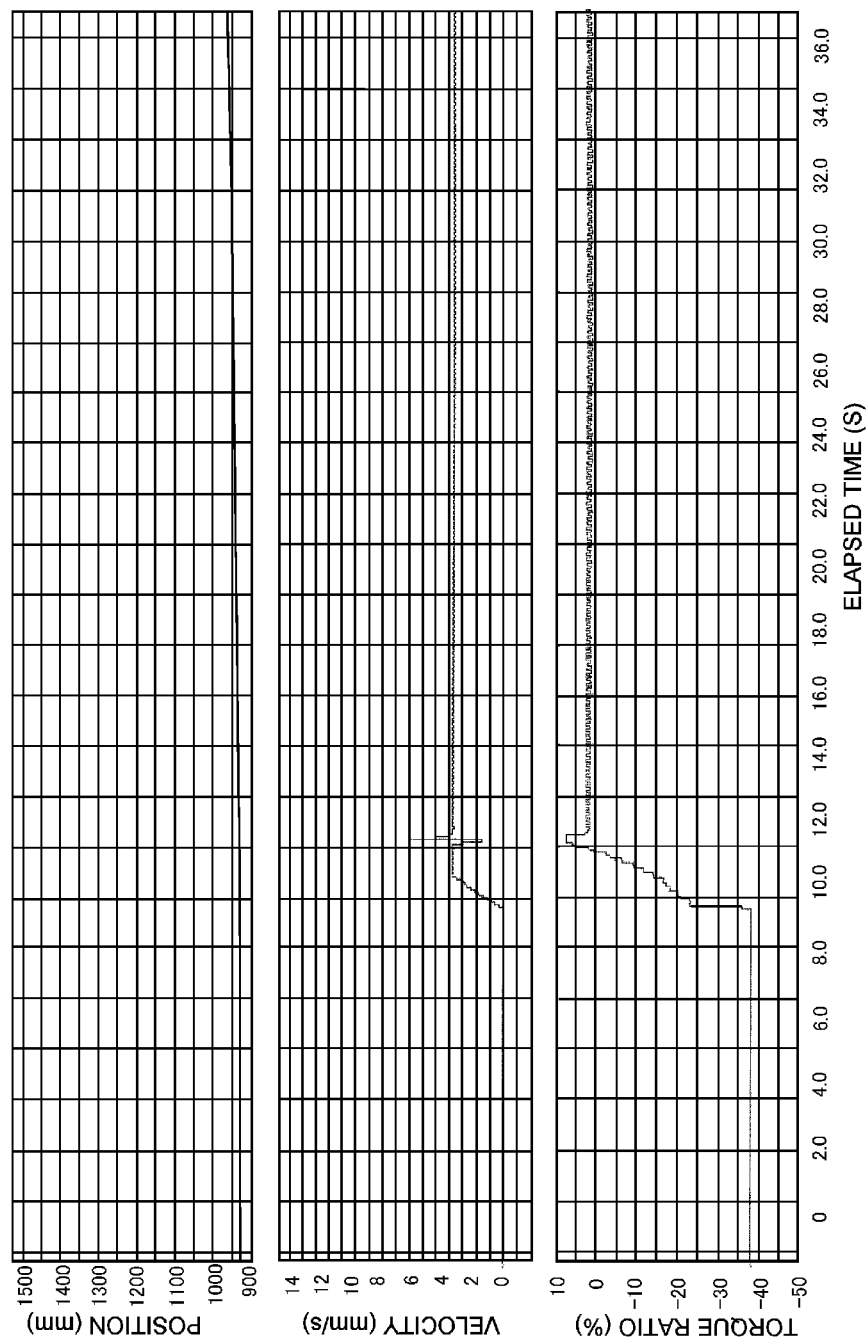
FIG. 7 is a view illustrating, in a case of limiting an upper limit of a torque ratio of a motor, a graph illustrating a relationship between an elapsed time and a position of a seal cap, a graph illustrating a relationship between an elapsed time and a movement velocity of the seal cap, and a graph illustrating a relationship between an elapsed time and a torque ratio of the motor.

Next, a case of removing the seal ring 221 having substantially no adhering force will now be described with reference to FIG. 7. In this case, the upper limit of the torque ratio of the motor 129 is limited to 7%, and the movement position of the seal cap 219 is controlled, and then, the seal ring 221 is removed. As shown in FIG. 7, although the adhering force of the seal ring 221 to the lower end surface of the process pipe 203 is substantially zero, just when the seal ring 221 is removed, a speed variation and a torque ratio variation are detected. In this way, it can be found that there is substantially adhering force even when the seal ring 221 has no adhering force. In addition, although just for a moment, it can be found that the torque ratio of the motor 129 is limited to 7%. In addition, the torque ratio after removing the seal ring 221 is 2% to 3% since an order speed of an operation torque after removing the seal ring 221 is low. As such, even when the seal ring 221 has no adhering force, there may be substantially adhering force, and thus, the upper limit of limiting the output torque of the motor 129 is set, so that the deformation (for example, vibration) of the seal cap 219, which is caused by the output of excessive torque and vibrates the boat 11 and negatively affects the wafers 10 accommodated in the boat 11 during a period that the seal ring 221 is removed from the lower end surface of the process pipe 203, can be suppressed. Thus, even when the seal ring 221 is not adhered to the lower end surface of the process pipe 203, it is necessary to set the upper limit of the output torque of the motor 129.

Comparison Example

Here, a process of unloading a boat in the related art will now be described with reference to FIG. 8.

Figure 8:
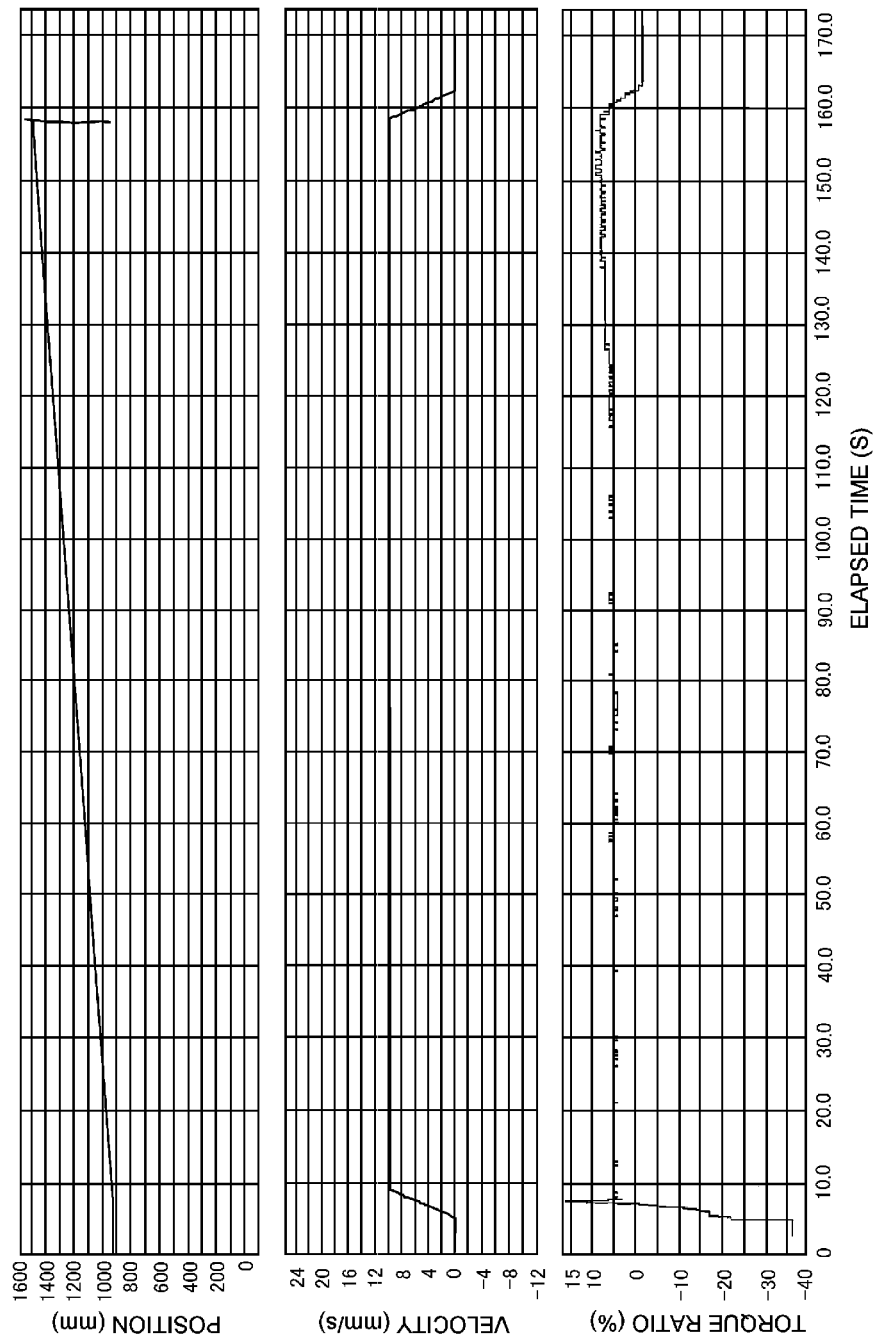
FIG. 8 is a view illustrating, in a case where a torque ratio of a motor is not limited, a graph illustrating a relationship between an elapsed time and a position of a seal cap, a graph illustrating a relationship between an elapsed time and a movement velocity of the seal cap, and a graph illustrating a relationship between an elapsed time and a torque ratio of the motor.

By the boat elevator 115, the seal cap 219 is pressed, for example, with a torque ratio of −37% as shown in FIG. 8, on the lower end surface of the process pipe 203 (substantially, the manifold 209) through the seal ring 221. At this time, the torque of the motor 129 is not limited, and thus, can be increased up to a rated torque of the motor 129. Thus, to remove the seal ring 221 closely contacting the lower end surface of the process pipe 203, the torque output from the motor 129 increases until the seal ring 221 is removed. Then, just when the seal ring 221 is removed, the seal ring 221 is removed from the lower end surface of the process pipe 203. At this time, the output torque of the motor 129 corresponds to a torque ratio of 17%. In addition, just when the seal ring 221 is removed from the lower end surface of the process pipe 203, a high acceleration is applied downward to the seal cap 219, so that the boat 11 placed on the upper surface of the seal cap 219 or the wafers 10 placed on the boat 11 are suspended when viewed from the position where the surface of the seal cap 219 is determined as a reference, which causes, for example, damage of the wafers 10, falling of particles, and dislocation. After that, from the graph illustrating a relationship between a position and a movement velocity, it can be found that the seal cap 219 and the boat 11 are moved downward at a constant movement velocity. In addition, from the graph illustrating a relationship between a position and an elapsed time, it can be found that the seal cap 219 is moved downward and lowered. At this time, the output torque of the motor 129 constantly corresponds to a torque ratio of about 5% although tiny vibrations.

Figure 9:
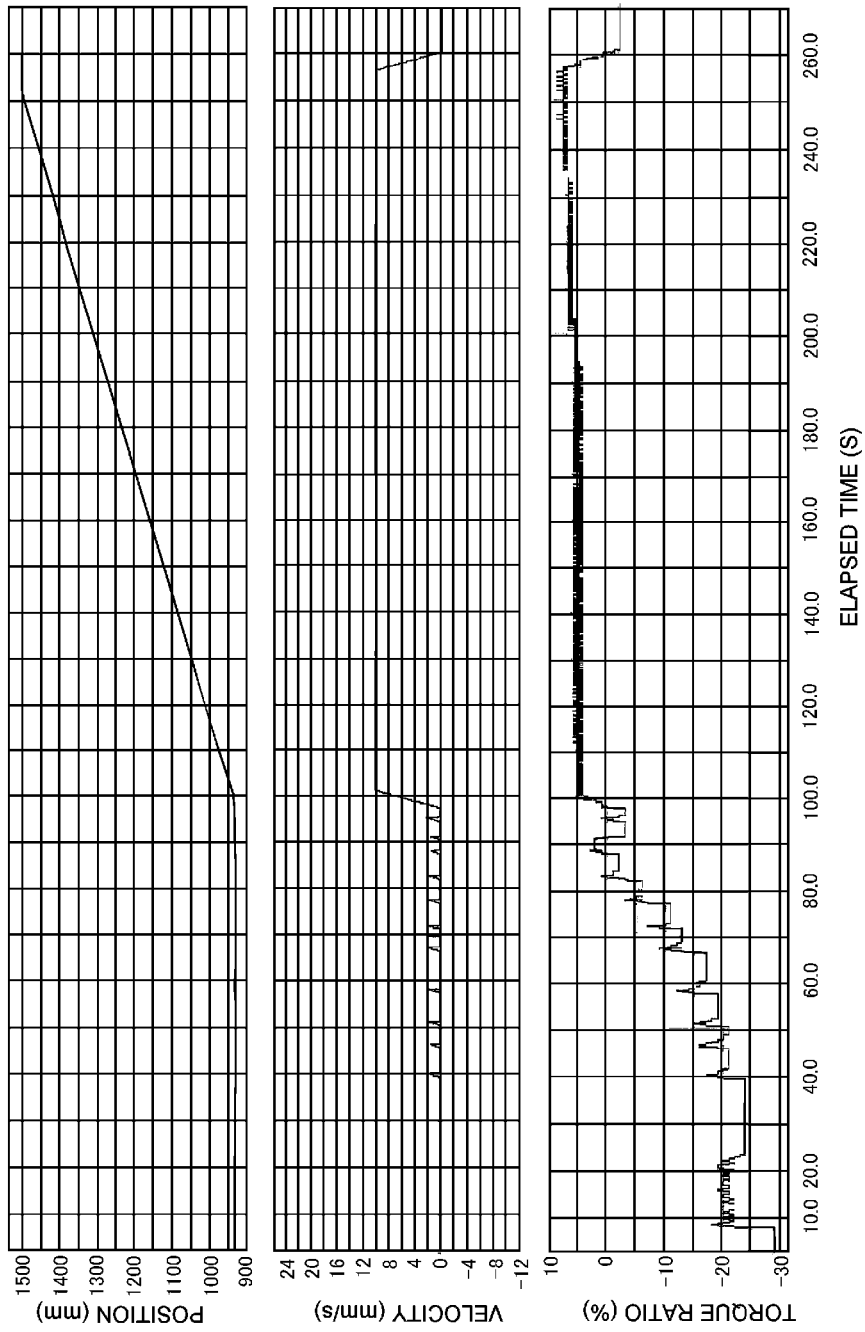
FIG. 9 is a view illustrating, in a case of minutely moving a seal cap, a graph illustrating a relationship between an elapsed time and a position of the seal cap, a graph illustrating a relationship between an elapsed time and a movement velocity of the seal cap, and a graph illustrating a relationship between an elapsed time and a torque ratio of the motor.

Still as a reference example, as shown in FIG. 9, when the seal ring 221 is removed from the lower end surface of the process pipe 203 or the surface of the seal cap 219, from an initial movement period of the seal cap 219 to a point when the seal ring 221 is completely removed, the seal cap 219 may be gradually moved to gradually decrease the adhering force of the seal ring 221. In FIG. 9, for about 60 seconds from about 40 seconds to about 100 seconds, the seal cap 219 is moved downward although a very small amount. In this way, the vibration of the seal cap 219 occurring when the seal cap 219 is removed is suppressed to prevent the vibration of the wafers 10 placed on the boat 11 and suppress the occurrence of particles (refer to Japanese Unexamined Patent Application Publication No. 2005-56905). In this case, as shown in FIG. 9, the output torque of the motor 129 increases in a stepwise fashion. In addition, when predetermined torque is output from the motor 129, the seal ring 221 is removed. However, an excessive time elapses from a point when the downward operation of the seal cap 219 starts to a point when the seal ring 221 is removed from the lower end surface of the process pipe 203. In addition, in FIG. 9, it takes about 254 seconds to unload the boat 11. However, in the above-described case in FIG. 5, it takes about 159 seconds to unload the boat 11. With respect to the unloading of the boat 11, when the case shown in FIG. 9 and the case shown in FIG. 5 are compared with each other, the case shown in FIG. 9 takes 95 seconds longer than the case shown in FIG. 5 does. This is because, although an operation time in a period when the seal ring 221 is not adhered and a tiny movement is unnecessary is substantially the same in the cases in FIG. 5 and FIG. 9, it takes time to minutely move the seal cap 219 in the case shown in FIG. 9. As a result, a time for unloading the wafers 10 from the process chamber 202 is significantly increased, and a total unloading time of the wafers 10 is increased, thereby reducing the throughput. In addition, the seal cap 219 may be moved at a low speed only in an adhering period of the seal ring 221, but it is difficult to fully check the adhering period of the seal ring 221, and thus, a period that the seal ring 221 is assumed to be adhered should be set to a wide period. To address these limitations, ways of improving the throughput will now be described.

As a substrate processing apparatus according to an embodiment of the present invention, in the substrate processing apparatus 101 described with reference to FIG. 1, FIG. 2, and FIG. 3, the controller 281 may control the motor 129 such that the movement velocity of the seal cap 219 after the removing of the seal ring 221 is higher than the speed that the seal ring 221 as a sealing member is removed from the lower end surface of the process pipe 203 or the surface of the seal cap 219 as a cover.

Second Embodiment of the Present Invention

A substrate processing apparatus according to a second embodiment of the present invention, for example, the substrate processing apparatus 101 described with reference to FIG. 1, FIG. 2, and FIG. 3 is configured as described below.

In the substrate processing apparatus 101, a pulse-driving motor is used as the motor 129. For example, a servo motor is used as the motor 129. In a case of using a servo motor, as shown in FIG. 1, when the seal ring 221 is adhered to the lower end surface of the process pipe 203 or the surface of the seal cap 219 by a certain cause (for example, such as heat of a process and attachment of byproducts), although a pulse for driving the motor 129 is continually input to the motor 129, the seal cap 219 may be maintained at a predetermined position without being lowered. At this time, the torque of the motor 129 is the upper limit of a torque (torque ratio) that can be set. Then, the pulse for driving the motor 129 is maintained. Then, just before the seal ring 221 is removed from the lower end surface of the process pipe 203, when the seal ring 221 is minutely adhered to the lower end surface of the process pipe 203 or the surface of the seal cap 219, the driving of the motor 129 tends to recover (digest) the maintained pulse, so that the motor 129 is driven with quick and high speed rotation and the seal cap 219 is lowered through the arm 128. At this time, since a quick downward acceleration is applied to the seal cap 219, the wafers 10 as substrates placed on the boat 11 may bounce up or fall down from the substrate rest positions.

At this time, the controller 281 of the substrate processing apparatus 101 according to the current embodiment is configured to control the torque of the motor 129 such that the wafers 10 are maintained at the rest positions within the boat 11 in a pulse recovery period occurring when, in the state where the pulse input to the motor 129 is maintained, the motor 129 is driven by the maintained pulse to remove the seal ring 221 from the lower end surface of the process pipe 203 or the surface of the seal cap 219. In detail, the upper limit of the output torque of the motor 129 is limited to, for example, a torque ratio of 7% or less. The upper limit is appropriately determined from a rated torque value of the motor 129 such that the wafers 10 are maintained at the rest positions within the boat 11 in the pulse recovery period.

Figure 10:
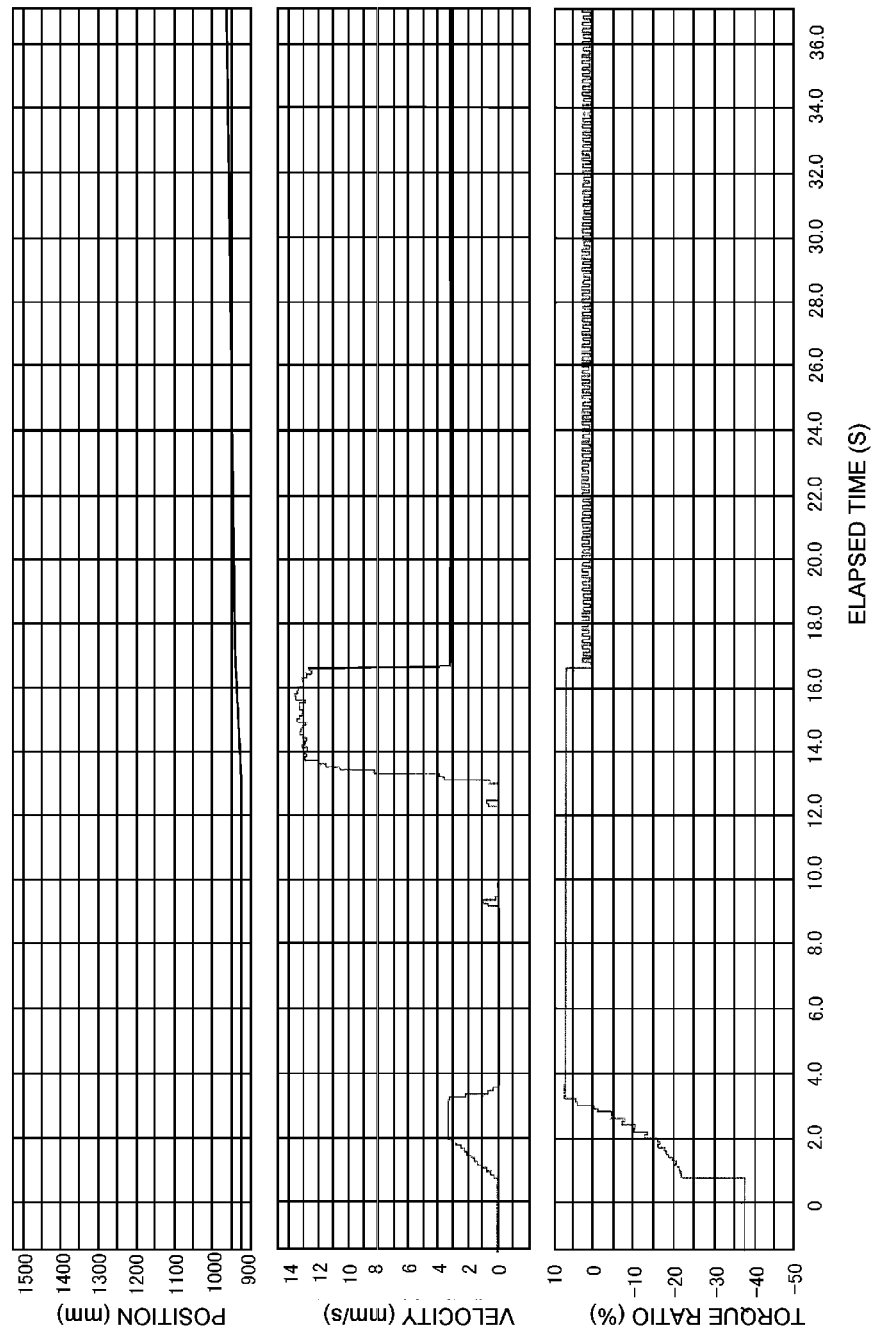
FIG. 10 is a view illustrating, in a case of limiting an upper limit of a torque ratio of a motor, a graph illustrating a relationship between an elapsed time and a position of a seal cap, a graph illustrating a relationship between an elapsed time and a movement velocity of the seal cap, and a graph illustrating a relationship between an elapsed time and a torque ratio of the motor.

As shown in FIG. 10, the upper limit of the output torque of the motor 129 is limited to the torque ratio of 7%. In this state, the motor 129 is driven to operate the boat elevator 115 and lower the seal cap 219 through the arm 128 in the direction of removing the seal ring 221 adhered to the lower end surface of the process pipe 203. At this time, by a certain cause as describe above, the seal ring 221 is adhered to the lower end surface of the process pipe 203 or the surface of the seal cap 219. In this state, as the motor 129 is driven, the output torque (torque ratio) of the motor 129 is not over the upper limit and is constant to the upper limit, and thus, greater torque than the upper limit is not applied. Then, the state where the seal ring 221 is adhered to the lower end surface of the process pipe 203 is maintained. In this state, although the pulse for driving the motor 129 is continually input to the motor 129, the seal cap 219 is not lowered. That is, the motor 129 cannot be driven, and the pulse for driving the motor 129 is maintained.

That is, just before the seal ring 221 is removed from the lower end surface of the process pipe 203, when the seal ring 221 is minutely adhered to the lower end surface of the process pipe 203 or the surface of the seal cap 219, the force of lowering the seal cap 219 by the driving of the motor 129 becomes greater than the adhering force of the seal ring 221 to the lower end surface of the process pipe 203. At this point, the seal cap 219 is removed from the lower end surface of the process pipe 203. Then, the motor 129 is driven with quick and high speed rotation to recover (digest) the maintained pulse, and thus, the seal cap 219 may be quickly lowered through the boat elevator 115. However, in the current embodiment, just when the seal ring 221 is removed, since the upper limit of the torque ratio of the motor 129 is set to, for example, 7% or less, the output torque from the motor 129 is not over the upper limit. Thus, the case where the wafers 10 accommodated in the boat 11 placed on the surface of the seal cap 219 bounce up and are damaged or vibrate to generate particles is prevented. Thus, the boat 11 accommodating the wafers 10 can be stably unloaded from the inside of the process chamber 202 of the process pipe 203.

In addition, in a case where the above-described torque control is not applied to the motor 129, when the motor 129 starts to quickly rotate at a high speed, the position of the seal cap 219 cannot be controlled. In this case, a high downward acceleration is applied to the seal cap 219 by a quick driving speed of the motor 129, and the wafers 10 accommodated in the boat 11 placed on the surface of the seal cap 219 are suspended.

Thus, since the upper limit of the torque ratio of the motor 129 is set to control the torque of the motor 129, in a period when, although the seal ring 221 contact the lower end surface of the process pipe 203, in the period that the seal ring 221 is not adhered to the lower end surface (substantially, in the period just before the seal ring 221 is removed), the motor 129 is driven with an order speed below the upper limit of the torque ratio, and just after the seal ring 221 is removed, the motor 129 is also driven at a high speed with the order speed below the upper limit of the torque ratio. Thus, an order may be made such that the speed just before the seal ring 221 is removed is suppressed to a low value, and thus, the acceleration is expected to be suppressed to a low value. In this way, the vibration due to the deformation of the seal cap 219 when the seal ring 221 is removed can be suppressed.

In addition, when the seal cap 219 is lowered to open the furnace port 207 of the process pipe 203, the torque of the motor 129 is controlled, and then, the driving speed of the motor 129 can be increased to increase the downward speed (movement velocity) of the seal cap 219 and unload the boat 11. In this way, the unloading time of the boat 11 can be further reduced. That is, the throughput in unloading the wafers 10 can be improved.

Third Embodiment of the Present Invention

Subsequently, a substrate processing apparatus according to a third embodiment of the present invention will now be described. In descriptions according to the current embodiment, the same components as those of the substrate processing apparatus 101 described with reference to FIG. 1, FIG. 2, and FIG. 3 are denoted by the same reference numerals.

In the above-described second embodiment, as a method of preventing the motor 129 (servo motor) from being rotated with quick and high speed rotation to recover (digest) the maintained pulse, a method of using a speed control without maintaining a pulse may be suggested. In detail, a speed control is performed in the period when that the seal ring 221 is presumed to be adhered, and a position control is performed after the furnace port 207 of the process pipe 203 is opened, and the seal cap 219 is lowered. A change from the speed control to the position control is made at the position where the seal ring 221 is presumed to be adhered (for example, at a downward position by 10 mm from the position in the sealing state). The position is recognized by monitoring, at the controller 281, an encoder (not shown) of the motor 129. In addition, when the preset position when the seal ring 221 is presumed to be adhered is recognized, the change from the speed control to the position control is made.

The speed control is performed by an upper level control device (not shown). The upper level control device orders the number of rotations (or a rotation angle) of the motor 129 as a servo motor, and determines an encoder value obtained by the encoder (not shown) installed on the motor 129 to order the driving or stopping of the motor 129 to the controller 281 as a servo motor control device. Thus, after obtaining the encoder value until receiving an order from the upper level control device, a communication time is required, and the seal cap 219 cannot be stopped at a desired position. However, in the speed control, to control the motor 129 by ordering the number of rotations (rotation angle) of the motor 129, it is unnecessary to use a pulse as an order. Thus, although the seal cap 219 is maintained at a constant position with an upper limit of a torque ratio specified by the controller 281 and is not lowered, the pulse is not maintained. Thus, even after the seal ring 221 is removed from the lower end surface of the process pipe 203, the motor 129 operates at an ordered speed without quick and high speed rotation.

There, the speed control that has the characteristics that a pulse train is not maintained is performed only in the period when the seal ring 221 is presumed to be adhered, as described above. In the meantime, the upper level control device monitors the encoder value at all times. Then, after checking from the encoder value that the seal ring 221 arrives at a position where the seal ring 221 is presumed to be adhered, the upper level control device gives an order of stopping the driving of the motor 129 to the controller 281 once. After that, the change from the speed control to the position control that can determine an accurate position is made.

In the position control, the upper control device gives an order of indicating a final target position of the seal cap 219 by using a pulse train, to the controller 281. Then, a position after the seal cap 219 is removed is read from the encoder value, and a difference between the read encoder value and the value of the final target position is calculated, and the difference as a position order value is ordered to the controller 281. The ordering of the difference is performed until the difference is equal to zero. The controller 281 operates the motor 129 to move the seal cap 219 to a position according to the position order value. By performing the position control as described above, the seal cap 219 can be stopped at an accurate position.

Simultaneously with the above-described change from the speed control to the position control, by changing the set upper limit of the torque ratio of the motor 129, the driving speed of the motor 129 can be increased as in the above-described second embodiment, and the downward speed of the seal cap 219 can be increased to unload the boat 11. In addition, instead of the above-described suppressing of the speed, in the same manner, a torque control without using a pulse as an order can be used. In the torque control, since a torque value for direct driving is ordered, the ordered torque value is used when the seal cap 219 is removed.

Fourth Embodiment of the Present Invention

Figure 11:
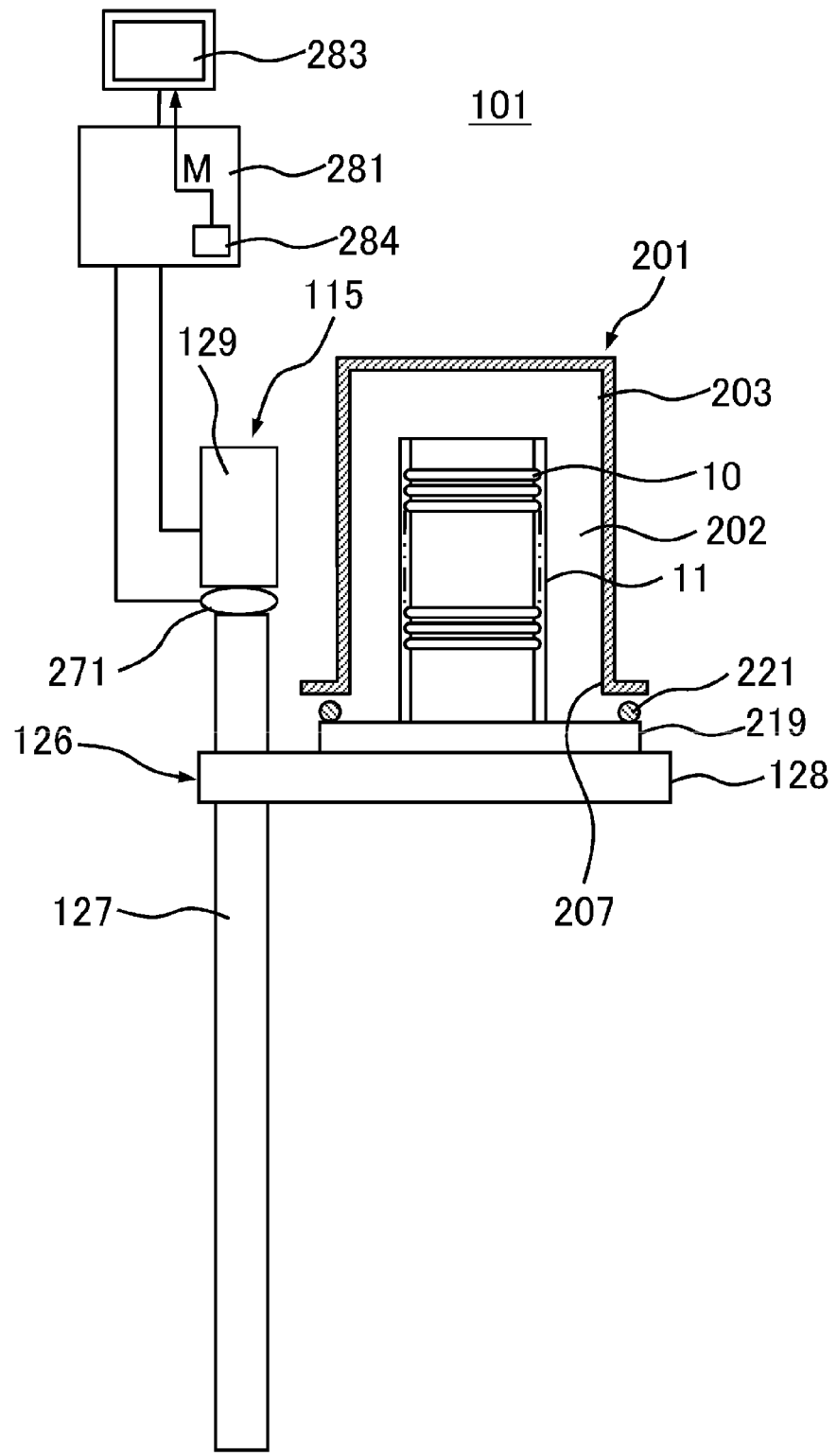
FIG. 11 is a schematic view illustrating a principal part of a substrate processing apparatus according to a third embodiment of the present invention.

Subsequently, a substrate processing apparatus according to a fourth embodiment of the present invention will now be described with reference to FIG. 11. In FIG. 11, the same components as those of the substrate processing apparatus 101 described with reference to FIG. 1, FIG. 2, and FIG. 3 are denoted by the same reference numerals.

As shown in FIG. 11, for example, the inside of the controller 281 is provided with an alarm 284 configured to measure an operation time that the seal ring 221 is removed from the lower end surface of the process pipe 203 or the surface of the seal cap 281, so that, in a case where the seal ring 221 is not removed and the removing is not ended within a predetermined operation time, the alarm 284 transmits a message M to the effect of the case to a display part 283 connected to the controller 281. The alarm 284 may be disposed out of the controller 281. To sum up, when the controller 281 controls the torque of the motor 129, the alarm 284 measures a driving time of the motor 129, and based on a result of the measuring, when the driving time of the motor 129 is over a preset driving limitation time of the motor 129, the alarm 284 transmits the message M to the effect that a removal operation is not ended within a predetermined operation time, to the display part 283. A way of sending the message M of the alarm 284 to an operator is not limited to the displaying of the display part 283, and thus, may be a sound such as a warning tone. In addition, the way may be a configuration that, when the alarm 284 generates the message M to the effect that the removal operation is not ended within the predetermined operation time, the controller 281 commands the motor 129 such that the driving of the motor 129 is automatically stopped.

The alarm 284 is installed in the case where, although the motor 129 is driven, the seal ring 221 cannot be removed within a predetermined time from the lower end surface of the process pipe 203 or the surface of the seal cap 219, which is effective in the following case. For example, when the adhering force of the seal ring 221 to the lower end surface of the process pipe 203 or the surface of the seal cap 219 is increased by degradation of the seal ring 221, and it is difficult to remove the seal ring 221, if the motor 129 is continually driven as it is, a trouble such as burning of the motor 129 may be made. Such a trouble of the motor 129 can be prevented.

Fifth Embodiment of the Present Invention

Figure 12:
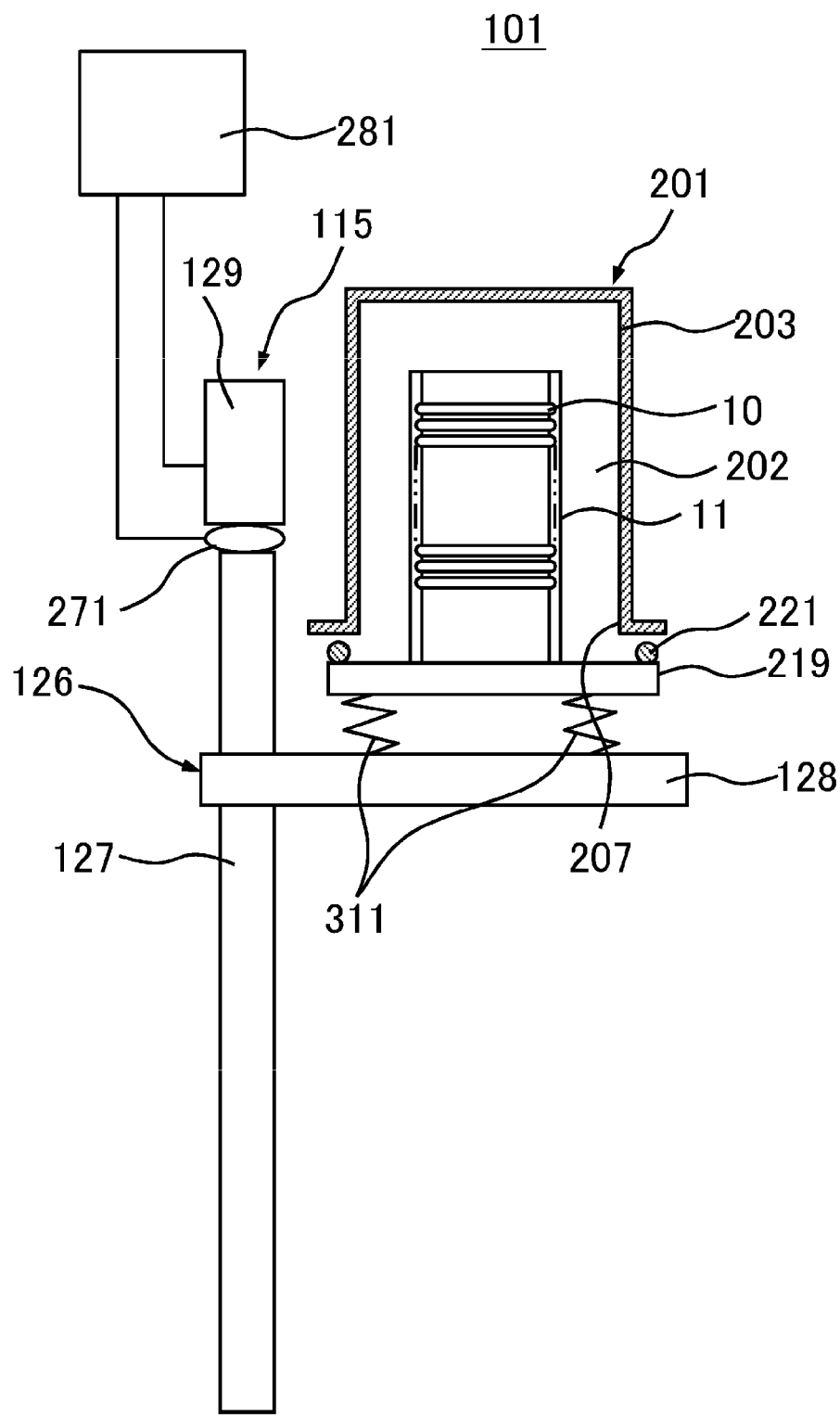
FIG. 12 is a schematic view illustrating a principal part of a substrate processing apparatus according to a fifth embodiment of the present invention.

A substrate processing apparatus according to a fifth embodiment of the present invention is configured such that a spring 311 as an elastic body is disposed between the seal cap 219 and the arm 128, as shown in FIG. 12, within the substrate processing apparatus 101 described with reference to FIG. 1, FIG. 2, and FIG. 3. Hereinafter, details thereof will be described with reference to FIG. 12.

As shown in FIG. 12, the substrate processing apparatus 101 according to the current embodiment includes the same one as the process furnace 201 of the substrate processing apparatus 101 described with reference to FIG. 1. In the process furnace 201, the process pipe 203 provided with the process chamber 202 and including a process tube to be described later is installed, and a heater as a heating mechanism is provided to surround the process pipe 203. In addition, the boat elevator 115 as an elevation mechanism along the side part of the process furnace 201 is installed. The boat elevator 115 is configured such that the arm 128 as a support part can be moved upward and downward by the driving mechanism 126. At the upper side of the arm 128, through the spring 311 as an over-damping elastic body, the seal cap 219 as a cover configured to open and close the furnace port 207 installed at the lower end of the process pipe 203 is supported. At the upper side of the seal cap 219, the seal ring 221 as a sealing member configured to seal the space between the seal cap 219 and the lower end surface of the process pipe 203 is installed. For example, the seal ring 221 is configured as an O ring. In addition, the upper surface of the seal cap 219 is configured such that the boat 11 configured to horizontally hold the wafers 10 as substrates and place the wafers 10 in multiple stages is placed on the upper surface of the seal cap 219.

For example, as the spring 311, a spring such as an air spring, a liquid spring, a leaf spring, and a coil spring, which are set to an over-damping condition, may be used. An air damper may be exemplified as the air spring, and a hydraulic damper may be exemplified as the liquid spring.

The driving mechanism 126 is configured as a ball screw structure in the same manner as the above-described one. In addition, at the upper end (or the lower end) of the ball screw shaft 127, the motor 129 configured to rotate the ball screw shaft 127 is installed. In this way, the motor 129 is driven to rotate the ball screw shaft 127, thereby moving the arm 128 upward and downward. By the above components, the seal cap 219 and the boat 11 placed on the upper surface thereof are moved upward and downward, and the boat 11 is loaded into or unloaded out of the process chamber 202. When the boat 11 is loaded in the process chamber 202, the seal cap 219 supported by the arm 128 is pressed through the seal ring 221 toward the lower end surface the process pipe 203 by the boat elevator 115, so that the inside of the process chamber 202 is air-tightly maintained.

In addition, on the driving shaft (not shown) of the motor 129, the torque sensor 271 configured to measure the torque of the driving shaft is installed. In addition, on the motor 129, the controller 281 configured to control the torque of the motor 129 with a predetermined value is installed. In this way, the controller 281 uses the torque sensor 271 to control the torque of the motor 129 such that the wafers 10 are maintained at the rest positions within the boat 11 in a recovery period of a deformation of the seal cap 219 (for example, a deformation due to a vibration) occurring when the seal ring 221 is removed from the lower end surface of the process pipe 203 or the surface of the seal cap 219. For example, the torque of the motor 129 is controlled within a predetermined range. A detailed example of the torque control for the motor 129 is the same as the previous one.

In addition, since the entire configuration of the substrate processing apparatus 101 and details of the process furnace 201 are the same as the previous ones, descriptions thereof will be the same as the previous ones.

In the substrate processing apparatus 101 provided with the spring 311, since the spring 311 has spring characteristics that exhibit over-damping between the seal cap 219 and the arm 128, quick lowering of the seal cap 219 and the boat 11 are suppressed.

For example, when the mass of the seal cap 219, the boat 11 including the wafers 10 placed thereon, and the seal ring 221 is defined as M, force F applied to the spring 311 is expressed as $F=Mg$. Here, g is the acceleration of gravity. In addition, when a displacement by the spring 311 is defined as x, and a spring constant of the spring 311 is defined as K, force Fs by the spring 311 is expressed as $Fs=Kx$. Here, when a certain vibration is applied to the seal cap 219, for M to undergo over-damping without a damped vibration, $Kx<Mg$ is necessary. As such, since the motion of the spring 311 is in an over-damping state, even when a load is applied to the spring 311, there is no vibration. Thus, since the spring 311 undergoes the over-damping, when the seal ring 221 is removed from the lower end surface of the process pipe 203, the seal cap 219 without a vibration is gently placed in a static state on the surface of the arm 128.

Here, a case where the motor 129 is driven to lower the arm 128 by the boat elevator 115 will now be described. As the arm 128 is lowered in the state where the seal ring 221 closely contacts and adheres to the lower end surface of the process pipe 203, the spring 311 is extended. At this time, elongation of the spring 311 is defined as x, and it is assumed that, at a point where the spring 311 is extended only with x, the seal ring 221 is removed from the lower end surface of the process pipe 203. Then, at this time, the force Fs by the spring 311 is Kx, and the force F applied to the spring 311 is expressed as $F=Mg$ by the seal cap 219, the boat 11 including the wafers 10 placed thereon, and the seal ring 221. Here, since Kx and Mg are set to $Kx<Mg$ such that the motion of the spring 311 is in the over-damping state, vibrations of the seal cap 219, the boat 11 including the wafers 10 placed thereon, and the seal ring 221 are over-damped, and the seal cap 219, the boat 11 including the wafers 10 placed thereon, and the seal ring 221 are gently placed in a static state on the surface of the arm 128.

In addition, when Fs is generated, if the torque of the motor 129 is defined as T and the lead of a ball screw is defined as l, the force Fs is expressed as $Fs=2\pi T/l$ when viewed from the motor 129. Here, since $Fs=Kx$, $2\pi T/l=Kx$, and since $Kx<Mg$, $2\pi T/l<Mg$. In a further variation, $T<Mgl/2\pi$. Here, when the torque of the motor 129 needed to move the arm 128 downward is defined as torque T', total torque Tall of the motor 129 needed to remove the seal ring 221 from the lower end surface of the process pipe 203 is expressed as Tall=T+T'. Thus, it is preferable that the motor 129 is used at the total torque Tall=T+T' or less.

Sixth Embodiment of the Present Invention

Figure 13B:
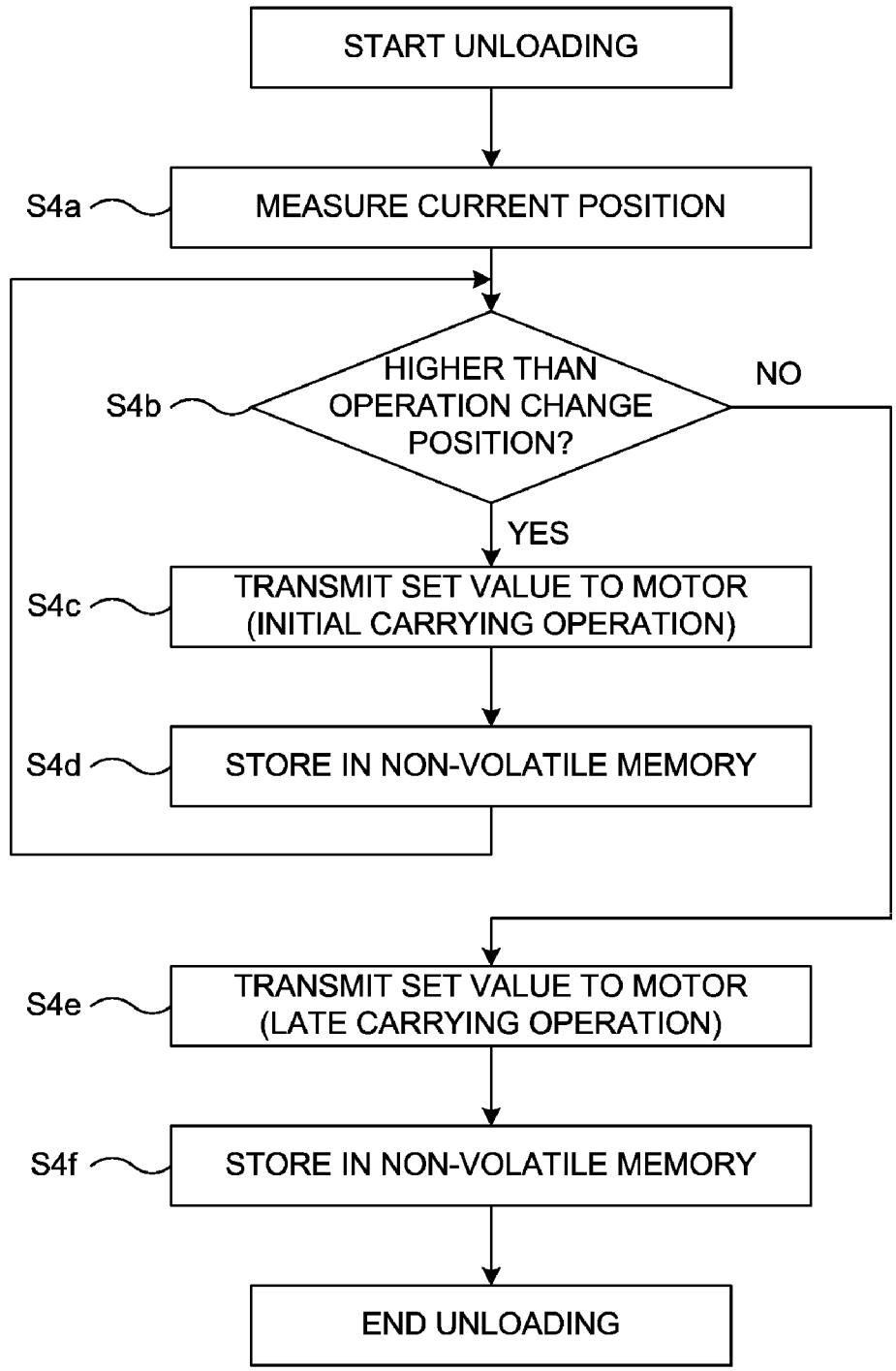
FIG. 13B is a flowchart illustrating a carrying control that is performed by a controller.

A substrate processing apparatus according to a sixth embodiment of the present invention is configured such that the unloading operation of the boat 11, that is, the driving control of the motor 129 is varied according a vertical position of the seal cap 219. Hereinafter, details thereof will be described with reference to FIG. 13A and FIG. 13B. FIG. 13A is a schematic view illustrating the unloading operation that is performed by the substrate processing apparatus according to the current embodiment, and FIG. 13B is a flowchart illustrating an unloading control that is performed by a controller.

When an unloading process S4 according to the current embodiment is started, the controller 281 measures a current vertical position of the seal cap 219 first (S4a). The vertical position of the seal cap 219 is measured, for example, using an optical sensor (not shown) installed on the ball screw shaft 127 or the arm 128, or using the encoder installed on the motor 129. Then, the measured vertical position of the seal cap 219 is compared with a predetermined 'operation change position' (S4b). The 'operation change position' is a vertical position of changing the unloading operation, which will be described later. Just after the unloading process S4 is started, since the vertical position of the seal cap 219 is a 'sealing position', and is higher than the 'operation change position', 'Yes' of FIG. 13B is performed, and the controller 281 transmits predetermined set information (operation directive information) to the motor 129 for starting a lowering of the seal cap 219 (S4c). At this time, the maximum torque of the motor 129, which is defined by the predetermined set information, is the same as the torque of the above-described embodiment. That is, the maximum torque is the torque that the wafers 10 are maintained at the rest positions within the boat 11 in the recovery period of a deformation of the seal cap 219 (for example, a vibration) occurring when the seal ring 221 is removed from the lower end surface of the process pipe 203 or the surface of the seal cap 219, for example, the maximum torque is set to 10% or less of a rated torque, preferably, is set to about 1% of the rated torque. In this way, when the lowering of the seal cap 219 is started, the suspension of the wafers 10 from the wafer rest positions (substrate rest positions) is prevented, so that the boat 11 can be unloaded from the inside of the process pipe 203 in the state where the wafers 10 are stably placed. Hereinafter, as such, an unloading operation based on set information is referred to as an 'initial carrying operation.

Then, simultaneously with the transmitting of the set information to the motor 129, the controller 281 stores the set information transmitted to the motor 129, for example, in a non-volatile memory included in the controller 281 such that the set information can be read (S4d). In this way, for example, even when power supplied to the substrate processing apparatus is abruptly cut off, and the controller 281 is activated again, the controller 281 can quickly read the set information just before the controller 281 is activated again, and transmit again the set information to the motor 129, and the above-described 'initial carrying operation' can be quickly started again.

When the operation of the motor 129 is started, the controller 281 repeatedly measures the vertical position of the seal cap 219 with a predetermined time period (for example, an interval of 200 msec). Then, if the seal cap 219 is disposed at a higher position than the 'operation change position', without changing the setting of the maximum torque to the motor 129 (with being limited to the above-described value), the above-described 'initial carrying operation' is continually performed on the motor 129.

Just after the driving of the motor 129 in the direction of lowering the seal cap 219 is started, the adhering state of the seal ring 221 to, for example, the lower end surface of the process pipe 203 is maintained as described above. Then, until reaching the set upper limit of the torque, the seal cap 219 is continually extended downward by the boat elevator 115, and simultaneously, the seal ring 221 is also continually extended downward. Then, when the force of extending the seal ring 221 downward is greater than the adhering force of the seal ring 221 to the lower end surface of the process pipe 203, the seal ring 221 is removed from the lower end surface of the process pipe 203. After that, the lowering of the seal cap 219 is actually started.

After that, when the seal cap 219 is lowered down to the above-described 'operation change position' or below, 'No' of FIG. 13B is performed, and the controller 281 transmits new set information to the motor 129 to increase (or maintain) the lowering speed of the seal cap 219 up to a predetermined speed (which is greater than the lowering speed in the initial carrying operation (S4e). In addition, at this time, the maximum torque of the motor 129 may be greater than the maximum torque in the initial carrying operation, for example, may be about 20% of the rated torque. As such, when the seal cap 219 is lowered down to the 'operation change position', the operation of the motor 129 is controlled to increase (or maintain) the lowering speed of the seal cap 219, thereby reducing the elapsed time of the unloading process S4 and improving the productivity of a substrate process. Hereinafter, the unloading operation based on the above setting may be also referred to as a 'late carrying operation'. In addition, when the 'initial carrying operation' is changed to the 'late carrying operation', the lowering speed of the seal cap 219 may be gradually changed to reduce damage to the wafers 10 due to a speed difference between the 'initial carrying operation' and the 'late carrying operation'.

Then, simultaneously with the transmitting of the new set information to the motor 129, the controller 281 stores the new set information transmitted to the motor 129, for example, in the non-volatile memory included in the controller 281 such that the new set information can be read (S4f). In this way, for example, even when power supplied to the substrate processing apparatus is abruptly cut off, and the controller 281 is activated again, the controller 281 can quickly read the set information just before the controller 281 is activated again, and transmit again the set information to the motor 129, and the above-described 'late carrying operation' can be quickly started again.

After that, the controller 281 operates the motor 129 at the maximum speed within a newly set allowable range of the torque, so as to quickly lower the seal cap 219 down to an 'unloading end position' shown in FIG. 13A, thereby completing the unloading process S4. In addition, when the seal cap 219 closes to the 'unloading end position', the controller 281 may change the set information of the motor 129 and decrease the lowering speed of the seal cap 219 down to a predetermined speed. In this way, a shock applied to the wafers 10 when the seal cap 219 arrives at the 'unloading end position' (when the lowering of the seal cap 219 is stopped) can be reduced.

In addition, in the above-described embodiment, the change from the 'initial carrying operation' to the 'late carrying operation' is continuously made without stopping the lowering of the seal cap 219, that is, without stopping the motor 129, but the present invention is not limited thereto. That is, the motor 129 is stopped first, and then, the above-described change may be made. In this case, the lowering speed of the seal cap 219 near the 'operation change position' may be decreased down to a predetermined speed. In this way, a shock applied to the wafers 10 when the seal cap 219 arrives at the 'operation change position' (when the lowering of the seal cap 219 is stopped) or a shock applied to the wafers 10 when the seal cap 219 goes away from the 'operation change position' (when the lowering of the seal cap 219 is started again) can be reduced.

In addition, in the above-described embodiment, the change from the 'initial carrying operation' to the 'late carrying operation' is made when the boat 11 is unloaded, but the present invention is not limited thereto, and thus, the change may be made when the boat 11 is loaded. In this case, an loading operation from the 'unloading end position' to the 'operation change position' and a loading operation from the 'operation change position' to the 'sealing position' may be performed in the same manner as the above-described 'late carrying operation' and the above-described 'initial carrying operation', respectively (however, each of carrying directions thereof is an upward direction). In addition, it is preferable that the maximum torque of the motor 129 in the 'late carrying operation' is, for example, about 60% of the rated torque.

In addition, in the above-described embodiment, a two-step change of the 'initial carrying operation' and the 'late carrying operation' is exemplified, but the present invention is not limited thereto, and thus, three or more steps may be sequentially performed in a change.

In the substrate processing apparatus and the method of manufacturing a semiconductor device, according to the present invention, the vibration of the cover occurring in the initial stage that the boat is unloaded from the inside of the process pipe can be suppressed.

Preferred Embodiments of the Present Invention

The present invention also includes the following embodiments.

(Supplementary Note 1)

According to a preferred embodiment of the present invention, there is provided a substrate processing apparatus comprising:

a boat for placing a substrate;

a process pipe configured to accommodate the boat;

a cover having the boat placed thereon, the cover being configured to open and close a furnace port installed on a lower end of the process pipe;

an elevation mechanism configured to move the cover upward and downward;

a motor configured to drive the elevation mechanism;

a sealing member configured to seal a space between the cover and a lower end surface of the process pipe; and a controller configured to control a torque of the motor such that the substrate is maintained at a rest position within the boat during a deformation recovery period of the cover occurring when the sealing member is removed from a surface of the cover or the lower end surface of the process pipe.

(Supplementary Note 2)

In the substrate processing apparatus of Supplementary Note 1, the controller controls the motor such that a movement velocity of the cover is higher in a period after the sealing member is removed than in a period when the sealing member is removed from the surface of the cover or the lower end surface of the process pipe.

(Supplementary Note 3)

In the substrate processing apparatus of Supplementary Note 1 or 2, the controller may control the torque of the motor only when the sealing member is removed from the lower end surface of the process pipe or the surface of the cover, and a movement velocity of the cover may be controlled in a driving period of the motor except for a period when the torque of the motor is controlled.

(Supplementary Note 4)

In the substrate processing apparatus of any one of Supplementary Notes 1 to 3, the controller may control the motor such that torque of the motor when the sealing member is pressed just before an operation of removing the sealing member from the lower end surface of the process pipe or the surface of the cover is started is smaller than torque of the motor when the sealing member is pressed against the lower end surface of the process pipe and the surface of the cover.

(Supplementary Note 5)

In the substrate processing apparatus of any one of Supplementary Notes 1 to 4, the controller may vary the torque of the motor in time series when the sealing member is removed from the lower end surface of the process pipe or the surface of the cover.

(Supplementary Note 6)

The substrate processing apparatus of any one of Supplementary Notes 1 to 5 may comprise an alarm that is configured to measure an operation time when the sealing member is removed from the lower end surface of the process pipe or the surface of the cover, and transmit a message to the effect that the removing of the sealing member is not ended within a predetermined operation time, to a display part connected to the controller.

(Supplementary Note 7)

In the substrate processing apparatus of any one of Supplementary Notes 1 to 6, the motor may be a pulse-driving motor, and the controller may control the torque of the motor such that the substrate is maintained at the rest position within the boat in a deformation recovery period of the cover occurring when, in a state where a pulse input to the motor is maintained, the motor is driven by the maintained pulse to remove the seal member from the surface of the cover or the lower end surface of the process pipe.

(Supplementary Note 8)

The substrate processing apparatus of any one of Supplementary Notes 1 to 7 may comprise an over-damping elastic body between the cover and a support part that is provided to the elevation mechanism supporting the cover and can be moved upward and downward.

(Supplementary Note 9)

In the substrate processing apparatus of any one of Supplementary Notes 1 to 8, the controller may control the torque of the motor such that an acceleration of the boat is equal to or less than the acceleration of gravity in the deformation recovery period of the cover occurring when the seal member is removed from the surface of the cover or the lower end surface of the process pipe.

(Supplementary Note 10)

In the substrate processing apparatus of any one of Supplementary Notes 1 to 9, the elevation mechanism may comprise a column and a support part that is moved upward and downward along the column by driving of the motor configured to support the cover, and the controller may control the torque of the motor such that the substrate is maintained at the rest position within the boat in a deformation recovery period of the support part occurring when the seal member is removed from the surface of the cover or the lower end surface of the process pipe.

(Supplementary Note 11)

According to another preferred embodiment of the present invention, there is provided a method of manufacturing a semiconductor device, the method comprising: processing a substrate placed on a boat within a process pipe; moving a cover sealing a furnace port of the process pipe via a sealing member downward to open the furnace port after processing the substrate; unloading the boat from the process pipe through the furnace port, while opening the cover simultaneously, wherein torque of a motor for driving an elevation mechanism for moving the cover downward is controlled such that the substrate is maintained at a rest position within the boat during a deformation recovery period of the cover occurring when the sealing member is removed from a lower end surface of the process pipe or a surface of the cover.

What is claimed is:

1. A substrate processing apparatus comprising:
   a boat accommodating a substrate;
   a process pipe configured to accommodate the boat;
   a cover disposed below the boat and configured to open and close a furnace port disposed at a lower end of the process pipe;
   an elevation mechanism configured to move the cover upward and downward;
   a motor configured to drive the elevation mechanism;
   a sealing member configured to seal a space between the cover and a lower end surface of the process pipe; and
   a controller configured to:
      control a speed of the motor and limit a torque of the motor to be lower than a predetermined upper limit of the torque until the cover reaches a predetermined position when the sealing member is separated from a surface of the cover or the lower end surface of the process pipe such that the substrate is maintained at a rest position in the boat during a recovery from a deformation of the cover occurring when the sealing member is separated from the surface of the cover or the lower end surface of the process pipe; monitor a current position of the cover; and control a rotation of the motor based on a difference between the current position of the cover and a target position of the cover after the cover reaches the predetermined position.

2. The substrate processing apparatus of claim 1, wherein the controller is configured to stop the motor when the current position reaches the target position.

3. The substrate processing apparatus of claim 1, wherein the predetermined upper limit of the torque is set such that an acceleration of the boat is equal to or smaller than a gravitational acceleration during the recovery from the deformation of the cover.

4. The substrate processing apparatus of claim 1, wherein an upper limit of the torque is the cover reaches the predetermined position.

5. A method of manufacturing a semiconductor device, the method comprising:
   opening a furnace port of a process pipe by lowering a cover sealing the furnace port via a sealing member after a substrate accommodated in a boat is processed within the process pipe and simultaneously unloading the boat from the process pipe via the furnace port; and
   controlling a speed of a motor configured to drive an elevation mechanism configured to move the cover upward and downward and simultaneously limiting a torque of the motor to be lower than a predetermined upper limit of the torque until the cover reaches a predetermined position when the sealing member is separated from a surface of the cover or a lower end surface of the process pipe such that the substrate is maintained at a rest position in the boat during a recovery from a deformation of the cover occurring when the sealing member is separated from the surface of the cover or the lower end surface of the process pipe, and controlling a rotation of the motor based on a difference between a current position of the cover and a target position of the cover after the cover reaches the predetermined position.

6. A method of opening a furnace port of a process pipe, the method comprising:
   controlling a speed of a motor configured to drive an elevation mechanism configured to move a cover upward and downward and simultaneously limiting a torque of the motor to be lower than a predetermined upper limit of the torque until the cover reaches a predetermined position when a sealing member is separated from a surface of the cover or a lower end surface of the process pipe such that a substrate is maintained at a rest position in a boat during a recovery from a deformation of the cover occurring when the sealing member is separated from the surface of the cover or the lower end surface of the process pipe, and controlling a rotation of the motor based on a difference between a current position of the cover and a target position of the cover after the cover reaches the predetermined position.

* * * * *